United States Patent
Sano et al.

(10) Patent No.: US 8,273,467 B2
(45) Date of Patent: Sep. 25, 2012

(54) ORGANIC ELECTROLUMINESCENT DEVICE

(75) Inventors: Satoshi Sano, Ashigarakami-gun (JP);
Tatsuya Igarashi, Ashigarakami-gun (JP); Masaru Kinoshita, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 1233 days.

(21) Appl. No.: 11/711,689

(22) Filed: Feb. 28, 2007

(65) Prior Publication Data
US 2007/0202358 A1    Aug. 30, 2007

(30) Foreign Application Priority Data

Feb. 28, 2006   (JP) ................. 2006-052475

(51) Int. Cl.
*B32B 19/00*   (2006.01)
*B32B 9/00*    (2006.01)
*H01J 1/62*    (2006.01)
*H01J 63/04*   (2006.01)
*H01L 29/08*   (2006.01)
*H01L 35/24*   (2006.01)
*H01L 51/00*   (2006.01)

(52) U.S. Cl. ........ 428/690; 558/303; 558/411; 428/917; 313/504; 313/506; 257/40; 257/E51.044; 257/E51.047

(58) Field of Classification Search .......... 428/690, 428/917; 313/504, 506; 257/40, E51.044, 257/E51.047; 558/411, 303
See application file for complete search history.

(56) References Cited

U.S. PATENT DOCUMENTS

| | | | |
|---|---|---|---|
| 6,316,130 B1 * | 11/2001 | Heuer et al. | 428/690 |
| 6,830,829 B2 * | 12/2004 | Suzuki et al. | 428/690 |
| 2006/0232198 A1 * | 10/2006 | Kawamura et al. | 313/504 |

FOREIGN PATENT DOCUMENTS

| | | | |
|---|---|---|---|
| JP | 329580 A | | 11/2002 |
| JP | 2003-105332 | * | 4/2003 |
| JP | 105332 A | | 4/2003 |
| JP | 255531 A | | 9/2005 |
| JP | 135160 A | | 5/2006 |
| WO | WO2004/108857 | * | 12/2004 |
| WO | WO 2004/108857 A1 | | 12/2004 |
| WO | WO 2005/042444 A2 | | 5/2005 |
| WO | WO 2005/042550 A1 | | 5/2005 |

* cited by examiner

*Primary Examiner* — Bijan Ahvazi
(74) *Attorney, Agent, or Firm* — Sughrue Mion, PLLC

(57) ABSTRACT

An organic electroluminescent device, which comprises: a pair of electrodes; and an organic compound layer including a light-emitting layer between the pair of electrodes, wherein the organic compound layer comprises a compound represented by formula (I):

Formula (I):

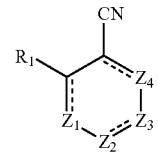

wherein $Z_1$, $Z_2$, $Z_3$ and $Z_4$ each independently represents an atom selected from the group consisting of carbon, nitrogen, sulfur and oxygen and necessary for forming an unsaturated 6-membered ring skeleton, the atom may have a hydrogen atom or a substituent; a bond in the unsaturated 6-membered ring indicates a single bond or a double bond; and $R_1$ represents a substituent.

14 Claims, No Drawings

ORGANIC ELECTROLUMINESCENT DEVICE

BACKGROUND OF THE INVENTION

1. Field of the Invention

The present invention relates to a light-emitting device, particularly, an organic electroluminescent device, which can emit light by converting electric energy into light.

2. Description of the Related Art

An organic electroluminescent device (hereinafter sometimes referred to as an "organic EL device") is attracting attention as a promising display device and being aggressively studied and developed because of its capability of high-brightness light emission with a low voltage, but more improvement is demanded on the durability, light emission efficiency, reduction of driving voltage, and the like. As for the light-emitting material, a device containing a tetradentate platinum complex such as phenylpyridine platinum complex and phenoxypyridine platinum complex (see, International Publication No. 05/042550, pamphlet, International Publication No. 05/042444, pamphlet and International Publication No. 04/108857, pamphlet) shows high efficiency and is taken note of. In order to attain higher durability, higher light emission efficiency and lower driving voltage, it is strongly demanded to develop a host material, particularly, an electron-transporting host material, which is combined with such a phosphorescent material. A cyano group is a strongly electron-withdrawing substituent and this substituent is effective for reducing the energy of lowest unoccupied molecular orbital (LUMO) and increasing the electron affinity. As regards a cyano group substituted to an aromatic compound, for example, a perfluorotrisphenylbenzonitrile compound and a production method thereof are disclosed in JP-A-2005-255531 (the term "JP-A" as used herein means an "unexamined published Japanese patent application"), but examples specifically demonstrating application to an organic electroluminescent device are not described.

In the specification of JP-A-2006-135160 (laid-open on 2006 May 25, is disclosed a compound wherein a central benzene ring is penta-substituted with a substituted or unsubstituted aryl group or an aromatic heterocyclic groups. However, it does not refer to the effects of a cyano group.

Further, in the JP-A-2003-105332 and the JP-A-2002-329580, is disclosed an aromatic compound having a cyano group as a specific example of the compound. However, no reference is made therein regarding effects produced by an aromatic compound having a cyano group characterized in that a condensed polycyclic aromatic compound or a condensed polycyclic hetero ring is substituted therewith. Also, light emission efficiency is not referred to.

SUMMARY OF THE INVENTION

An object of the present invention is to provide a light-emitting device with low driving voltage and high durability. Another object of the present invention is to provide a light-emitting device with low driving voltage and high light emission efficiency.

This object can be attained by the following means.

(1) An organic electroluminescent device, which comprises:
a pair of electrodes; and
an organic compound layer including a light-emitting layer between the pair of electrodes,
wherein the organic compound layer comprises a compound represented by formula (I):

Formula (I):

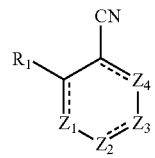

wherein $Z_1$, $Z_2$, $Z_3$ and $Z_4$ each independently represents an atom selected from the group consisting of carbon, nitrogen, sulfur and oxygen and necessary for forming an unsaturated 6-membered ring skeleton, the atom may have a hydrogen atom or a substituent;
a bond in the unsaturated 6-membered ring indicates a single bond or a double bond; and
$R_1$ represents a substituent.

(2) The organic electroluminescent device as described in (1) above,
wherein formula (I) is represented by any one of formulae (II-a), (II-b) and (II-c):

Formula (II-a):

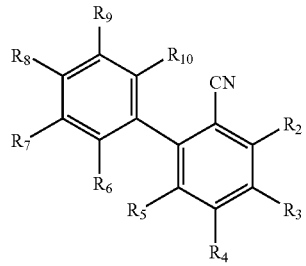

wherein $R_2$, $R_3$, $R_4$, $R_5$, $R_6$, $R_7$, $R_8$, $R_9$ and $R_{10}$ each independently represents a hydrogen atom or a substituent, when $R_2$, $R_3$, $R_4$, $R_5$, $R_6$, $R_7$, $R_8$, $R_9$ and $R_{10}$ each represents a substituent, the substituent may further have a substituent; and
pairs of $R_2$ and $R_3$, $R_3$ and $R_4$, $R_4$ and $R_5$, $R_5$ and $R_6$, $R_6$ and $R_7$, $R_7$ and $R_8$, $R_8$ and $R_9$, and $R_9$ and $R_{10}$, each may combine to form a ring, Formula (II-b):

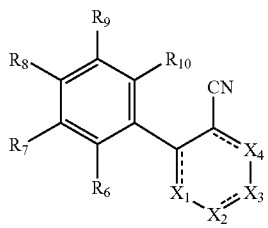

wherein $X_1$, $X_2$, $X_3$ and $X_4$ each independently represents an atomic group selected from the group consisting of carbon and nitrogen and necessary for forming an unsaturated heterocyclic skeleton together with carbon atoms, the unsaturated heterocyclic ring constituted by the carbon atoms, $X_1$, $X_2$, $X_3$ and $X_4$ may have a hydrogen atom or a substituent;

$R_6$, $R_7$, $R_8$, $R_9$ and $R_{10}$ have the same meanings as $R_6$, $R_7$, $R_8$, $R_9$ and $R_{10}$ in formula (II-a); and a bond in the unsaturated heterocyclic ring indicates a single bond or a double bond, and Formula (II-c):

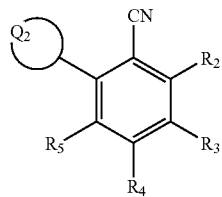

wherein $Q_2$ represents an atomic group selected from the group consisting of carbon, nitrogen, sulfur and oxygen and necessary for forming an unsaturated heterocyclic skeleton together with a carbon atom, the unsaturated heterocyclic ring constituted by the carbon atom and $Q_2$ may have a hydrogen atom or a substituent;

$R_2$, $R_3$, $R_4$ and $R_5$ have the same meanings as $R_2$, $R_3$, $R_4$ and $R_5$ in formula (II-a); and a bond in the unsaturated heterocyclic ring indicates a single bond or a double bond.

(3) The organic electroluminescent device as described in (1) above, wherein $Z_1$, $Z_2$, $Z_3$ and $Z_4$ in formula (I) each independently represents a carbon atom or a nitrogen atom.

(4) The organic electroluminescent device as described in (2) above, wherein formula (I) is represented by formula (II-a), and formula (II-a) is represented by formula (III):

Formula (III):

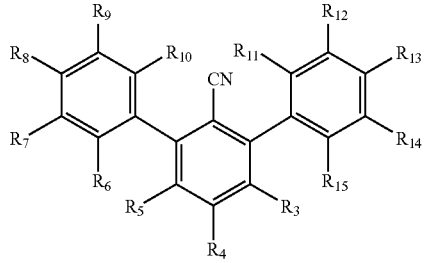

wherein $R_{11}$, $R_{12}$, $R_{13}$, $R_{14}$ and $R_{15}$ each independently represents a hydrogen atom or a substituent, when $R_{11}$, $R_{12}$, $R_{13}$, $R_{14}$ and $R_{15}$ each represents a substituent, the substituent may further have a substituent;

pairs of $R_3$ and $R_{15}$, $R_{11}$ and $R_{12}$, $R_{12}$ and $R_{13}$, $R_{13}$ and $R_{14}$, and $R_{14}$ and $R_{15}$, each may combine to form a ring; and $R_3$, $R_4$, $R_5$, $R_6$, $R_7$, $R_8$, $R_9$ and $R_{10}$ have the same meanings as $R_3$, $R_4$, $R_5$, $R_6$, $R_7$, $R_8$, $R_9$ and $R_{10}$ in formula (II-a).

(5) The organic electroluminescent device as described in (4) above, wherein formula (III) is represented by formula (IV):

Formula (IV):

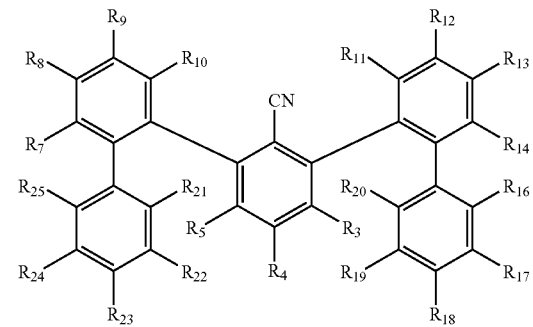

wherein $R_{16}$, $R_{17}$, $R_{18}$, $R_{19}$, $R_{20}$, $R_{21}$, $R_{22}$, $R_{23}$, $R_{24}$ and $R_{25}$ each independently represents a hydrogen atom or a substituent, when $R_{16}$, $R_{17}$, $R_{18}$, $R_{19}$, $R_{20}$, $R_{21}$, $R_{22}$, $R_{23}$, $R_{24}$ and $R_{25}$ each represents a substituent, the substituent may further have a substituent; and pairs of $R_{14}$ and $R_{16}$, $R_7$ and $R_{25}$, $R_{16}$ and $R_{17}$, $R_{17}$ and $R_{18}$, $R_{18}$ and $R_{19}$, $R_{19}$ and $R_{20}$, $R_{21}$ and $R_{22}$, $R_{22}$ and $R_{23}$, $R_{23}$ and $R_{24}$, and $R_{24}$ and $R_{25}$, each may combine to form a ring;

$R_3$, $R_4$, $R_5$, $R_7$, $R_8$, $R_9$ and $R_{10}$ have the same meanings as $R_3$, $R_4$, $R_5$, $R_7$, $R_8$, $R_9$ and $R_{10}$ in formula (III); and $R_{11}$, $R_{12}$, $R_{13}$ and $R_{14}$ have the same meanings as $R_{11}$, $R_{12}$, $R_{13}$ and $R_{14}$ in formula (III).

(6) The organic electroluminescent device as described in (4) above, wherein formula (III) is represented by formula (V):

Formula (V):

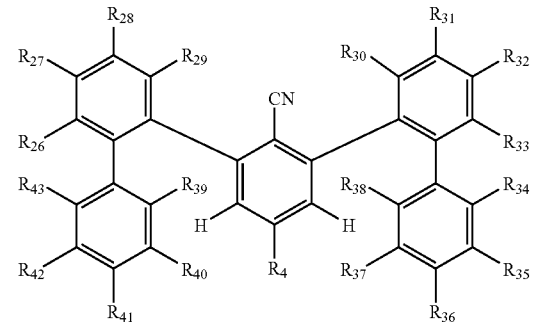

wherein $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each independently represents a hydrogen atom or a substituent, when $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a substituent, the substituent may further have a substituent, provided that pairs of $R_{26}$ and $R_{27}$, $R_{26}$ and $R_{43}$, $R_{26}$ and $R_{39}$, $R_{27}$ and $R_{28}$, $R_{28}$ and $R_{29}$, $R_{30}$ and $R_{31}$, $R_{31}$ and $R_{32}$, $R_{32}$ and $R_{33}$, $R_{33}$ and $R_{34}$, $R_{33}$ and $R_{38}$, $R_{34}$ and $R_{35}$, $R_{35}$ and $R_{36}$, $R_{36}$ and $R_{37}$, $R_{37}$ and $R_{38}$, $R_{39}$ and $R_{40}$, $R_{40}$ and $R_{41}$, $R_{41}$ and $R_{42}$, and $R_{42}$ and $R_{43}$, each does not combine to form a condensed ring; and $R_4$ has the same meanings as $R_4$ in formula (III).

(7) The organic electroluminescent device as described in (4) above,
wherein formula (III) is represented by formula (VI):

Formula (VI):

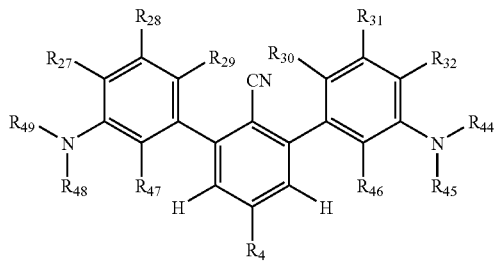

wherein $R_{44}$, $R_{45}$, $R_{48}$ and $R_{49}$ each independently represents a hydrogen atom or a substituent, when $R_{44}$, $R_{45}$, $R_{48}$ and $R_{49}$ each represents a substituent, the substituent may further have a substituent;

pairs of $R_{44}$ and $R_{45}$, and $R_{48}$ and $R_{49}$, each may combine to form a ring;

$R_{46}$ and $R_{47}$ each independently represents a hydrogen atom or a substituent, when $R_{46}$ and $R_{47}$ each represents a substituent, the substituent may further have a substituent, provided that when $R_{27}$, $R_{28}$, $R_{29}$, $R_{30}$, $R_{31}$, $R_{32}$, $R_{46}$ and $R_{47}$ each represents a substituent, pairs of $R_{32}$ and $R_{44}$, $R_{32}$ and $R_{45}$, $R_{44}$ and $R_{46}$, $R_{45}$ and $R_{46}$, $R_{47}$ and $R_{48}$, $R_{47}$ and $R_{49}$, $R_{49}$ and $R_{27}$, and $R_{27}$ and $R_{48}$, each does not combine to form a condensed ring;

$R_4$ has the same meanings as $R_4$ in formula (III); and $R_{27}$, $R_{28}$, $R_{29}$, $R_{30}$, $R_{31}$ and $R_{32}$ have the same meanings as $R_{27}$, $R_{28}$, $R_{29}$, $R_{30}$, $R_{31}$ and $R_{32}$ in formula (V) (That is, $R_{27}$, $R_{28}$, $R_{29}$, $R_{30}$, $R_{31}$ and $R_{32}$ each independently represents a hydrogen atom or a substituent, and when $R_{27}$, $R_{28}$, $R_{29}$, $R_{30}$, $R_{31}$ and $R_{32}$ each represents a substituent, the substituent may further have a substituent, but pairs of $R_{27}$ and $R_{28}$, $R_{28}$ and $R_{29}$, $R_{30}$ and $R_{31}$, $R_{31}$ and $R_{32}$, each does not combine to form a condensed ring.)

(8) The organic electroluminescent device as described in (4) above,
wherein formula (III) is represented by formula (VII):

Formula (VII):

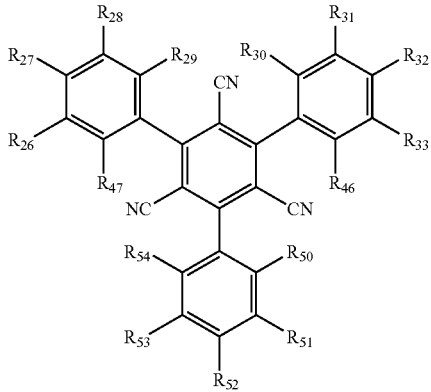

wherein $R_{50}$, $R_{51}$, $R_{52}$, $R_{53}$ and $R_{54}$ each independently represents a hydrogen atom or a substituent, when $R_{50}$, $R_{51}$, $R_{52}$, $R_{53}$ and $R_{54}$ each represents a substituent, the substituent may further have a substituent, but pairs of $R_{50}$ and $R_{51}$, $R_{51}$ and $R_{52}$, $R_{52}$ and $R_{53}$, and $R_{53}$ and $R_{54}$, each does not combine to form a condensed ring;

$R_{26}$, $R_{27}$, $R_{28}$, $R_{29}$, $R_{30}$, $R_{31}$, $R_{32}$ and $R_{33}$ have the same meanings as $R_{26}$, $R_{27}$, $R_{28}$, $R_{29}$, $R_{30}$, $R_{31}$, $R_{32}$ and $R_{33}$ in formula (V); and $R_{46}$ and $R_{47}$ have the same meanings as $R_{46}$ and $R_{47}$ in formula (VI). (That is, $R_{26}$, $R_{27}$, $R_{28}$, $R_{29}$, $R_{30}$, $R_{31}$, $R_{32}$ and $R_{33}$ each independently represents a hydrogen atom or a substituent, and when $R_{26}$, $R_{27}$, $R_{28}$, $R_{29}$, $R_{30}$, $R_{31}$, $R_{32}$ and $R_{33}$ each represents a substituent, the substituent may further have a substituent, but pairs of $R_{26}$ and $R_{27}$, $R_{27}$ and $R_{28}$, $R_{28}$ and $R_{29}$, $R_{30}$ and $R_{31}$, $R_{31}$ and $R_{32}$, and $R_{32}$ and $R_{33}$, each does not combine to form a condensed ring. Further, $R_{46}$ and $R_{47}$ each independently represents a hydrogen atom or a substituent, and when $R_{46}$ and $R_{47}$ each represents a substituent, the substituent may further have a substituent, but pairs of $R_{46}$ and $R_{33}$, and $R_{47}$ and $R_{26}$, each does not combine to form a condensed ring.)

(9) The organic electroluminescent device as described in any of (1) to (8) above,
wherein the light-emitting layer comprises at least one kind of a triplet-emission material.

(10) The organic electroluminescent device as described in (9) above,
wherein the at least one kind of triplet-emission material is a platinum complex or an iridium complex.

(11) The organic electroluminescent device as described in (10) above,
wherein the at least one kind of triplet-emission material is a platinum complex.

(12) A compound represented by formula (V):

Formula (V):

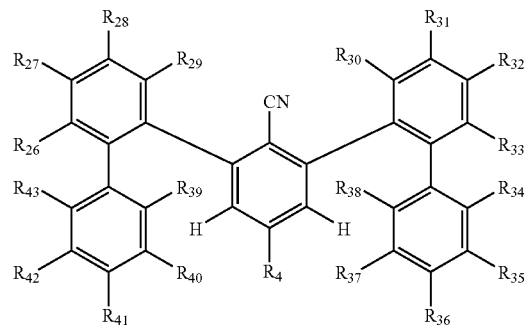

wherein $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each independently represents a hydrogen atom or a substituent, when $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a substituent, the substituent may further have a substituent, provided that pairs of $R_{26}$ and $R_{27}$, $R_{26}$ and $R_{43}$, $R_{26}$ and $R_{39}$, $R_{27}$ and $R_{28}$, $R_{28}$ and $R_{29}$, $R_{30}$ and $R_{31}$, $R_{31}$ and $R_{32}$, $R_{32}$ and $R_{33}$, $R_{33}$ and $R_{34}$, $R_{33}$ and $R_{38}$, $R_{34}$ and $R_{35}$, $R_{35}$ and $R_{36}$, $R_{36}$ and $R_{37}$, $R_{37}$ and $R_{38}$, $R_{39}$ and $R_{40}$, $R_{40}$ and $R_{41}$, $R_{41}$ and $R_{42}$, and $R_{42}$ and $R_{43}$, each does not combine to form a condensed ring; and $R_4$ represents a hydrogen atom or a substituent.

(13) A compound represented by formula (VI):

Formula (VI):

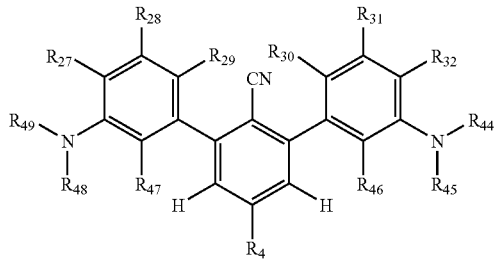

wherein $R_{44}$, $R_{45}$, $R_{48}$ and $R_{49}$ each independently represents a hydrogen atom or a substituent, when $R_{44}$, $R_{45}$, $R_{48}$ and $R_{49}$ each represents a substituent, the substituent may further have a substituent; and pairs of $R_{44}$ and $R_{45}$, and $R_{48}$ and $R_{49}$, each may combine to form a ring;

$R_{46}$ and $R_{47}$ each independently represents a hydrogen atom or a substituent, and when $R_{46}$ and $R_{47}$ each represents a substituent, the substituent may further have a substituent, provided that when $R_{27}$, $R_{28}$, $R_{29}$, $R_{30}$, $R_{31}$, $R_{32}$, $R_{46}$ and $R_{47}$ each represents a substituent, pairs of $R_{32}$ and $R_{44}$, $R_{32}$ and $R_{45}$, $R_{44}$ and $R_{46}$, $R_{45}$ and $R_{46}$, $R_{47}$ and $R_{48}$, $R_{47}$ and $R_{49}$, $R_{49}$ and $R_{27}$, and $R_{27}$ and $R_{48}$, each does not combine to form a condensed ring;

$R_4$ represents a hydrogen atom or a substituent; and $R_{27}$, $R_{28}$, $R_{29}$, $R_{30}$, $R_{31}$, and $R_{32}$ each independently represents a hydrogen atom or a substituent, when $R_{27}$, $R_{28}$, $R_{29}$, $R_{30}$, $R_{31}$ and $R_{32}$ each represents a substituent, the substituent may further have a substituent, but pairs of $R_{27}$ and $R_{28}$, $R_{28}$ and $R_{29}$, $R_{30}$ and $R_{31}$, and $R_{31}$ and $R_{32}$, each does not combine to form a condensed ring.

(14) The organic electroluminescent device as described in any of (1) to (11) above,
wherein a layer comprising the compound represented by any one of formulae (I), (II-a), (II-b), (II-c), (III), (IV), (V), (VI) and (VII) is adjacent to a layer comprising an oxide containing at least one of an alkaline metal and an alkaline earth metal.

(15) The organic electroluminescent device as described in any of (1) to (11) above,
wherein a layer comprising the compound represented by any one of formulae (I), (II-a), (II-b), (II-c), (III), (IV), (V), (VI) and (VII) is adjacent to a layer comprising at least one of an alkaline metal and an alkaline earth metal.

(16) The organic electroluminescent device as described in any of (1) to (11) above,
wherein a layer comprising the compound represented by any one of formulae (I), (II-a), (II-b), (II-c), (III), (IV), (V), (VI) and (VII) is adjacent to a layer comprising a halide containing at least one of an alkaline metal and an alkaline earth metal.

(17) The organic electroluminescent device as described in any of (1) to (16) above,
wherein the compound represented by any one of formulae (I), (II-a), (II-b), (II-c), (III), (IV), (V), (VI) and (VII) has the lowest excited triplet energy level of from 65 kcal/mol (272.35 kJ/mol) to 95 kcal/mol (398.05 kJ/mol).

(18) The organic electroluminescent device as described in any of (1) to (17) above, wherein the compound represented by any one of formulae (I), (II-a), (II-b), (II-c), (III), (IV), (V), (VI) and (VII) has a glass transition temperature of from 110 to 400° C.

DETAILED DESCRIPTION OF THE INVENTION

In the present invention, the compounds of formulae (I), (II-a), (II-b), (II-c), (III), (IV), (V), (VI) and (VII) are used in the same meaning as the "compound of the present invention". Also, the organic electroluminescent device having an organic compound layer containing the compound of the present invention is used in the same meaning as the "(light-emitting) device of the present invention".

In the present specification, the substituent group A used in relation to the compound of the present invention is defined as follows.

(Substituent Group A)

An alkyl group (preferably having a carbon number of 1 to 30, more preferably from 1 to 20, still more preferably from 1 to 10, e.g., methyl, ethyl, iso-propyl, tert-butyl, n-octyl, n-decyl, n-hexadecyl), a cycloalkyl group (preferably having a carbon number of 3 to 30, more preferably from 3 to 20, still more preferably from 3 to 10, e.g., cyclopropyl, cyclopentyl, cyclohexyl), an alkenyl group (preferably having a carbon number of 2 to 30, more preferably from 2 to 20, still more preferably from 2 to 10, e.g., vinyl, allyl, 2-butenyl, 3-pentenyl), an alkynyl group (preferably having a carbon number of 2 to 30, more preferably from 2 to 20, still more preferably from 2 to 10, e.g., propargyl, 3-pentynyl), a monocyclic aryl group (e.g., phenyl), an amino group (preferably having a carbon number of 0 to 30, more preferably from 0 to 20, still more preferably from 0 to 10, e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10, e.g., methoxy, ethoxy, butoxy, 2-ethylhexyloxy), an aryloxy group (preferably having a carbon number of 6 to 30, more preferably from 6 to 20, still more preferably from 6 to 12, e.g., phenyloxy, 1-naphthyloxy, 2-naphthyloxy), a heterocyclic oxy group (preferably having a carbon number of 1 to 30, more preferably from 1 to 20, still more preferably from 1 to 12, e.g., pyridyloxy, pyrazyloxy, pyrimidyloxy, quinolyloxy), an acyl group (preferably having a carbon number of 1 to 30, more preferably from 1 to 20, still more preferably from 1 to 12, e.g., acetyl, benzoyl, formyl, pivaloyl), an alkoxycarbonyl group (preferably having a carbon number of 2 to 30, more preferably from 2 to 20, still more preferably from 2 to 12, e.g., methoxycarbonyl, ethoxycarbonyl), an aryloxycarbonyl group (preferably having a carbon number of 7 to 30, more preferably from 7 to 20, still more preferably from 7 to 12, e.g., phenyloxycarbonyl), an acyloxy group (preferably having a carbon number of 2 to 30, more preferably from 2 to 20, still more preferably from 2 to 10, e.g., acetoxy, benzoyloxy), an acylamino group (preferably having a carbon number of 2 to 30, more preferably from 2 to 20, still more preferably from 2 to 10, e.g., acetylamino, benzoylamino), an alkoxycarbonylamino group (preferably having a carbon number of 2 to 30, more preferably from 2 to 20, still more preferably from 2 to 12, e.g., methoxycarbonylamino), an aryloxycarbonylamino group (preferably having a carbon number of 7 to 30, more preferably from 7 to 20, still more preferably from 7 to 12, e.g., phenyloxycarbonylamino), a sulfonylamino group (preferably having a carbon number of 1 to 30, more preferably from 1 to 20, still more preferably from 1 to 12, e.g., methanesulfonylamino, benzenesulfonylamino), a sulfamoyl group (preferably having a carbon number of 0 to 30, more preferably from 0 to 20, still more preferably from 0 to 12, e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12, e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12, e.g., methylthio, ethylthio), an arylthio group (preferably having a carbon number of 6 to 30, more preferably from 6 to 20, still more preferably from 6 to 12, e.g., phenylthio), a heterocyclic thio group (preferably having a carbon number of 1 to 30, more preferably from 1 to 20, still more preferably from 1 to 12, e.g., pyridylthio, 2-benzimidazolylthio, 2-benzoxazolylthio, 2-benzothiazolylthio), a sulfonyl group (preferably having a carbon number of 1 to 30, more preferably from 1 to 20, still more preferably from 1 to 12, e.g., mesyl, tosyl), a sulfinyl group (preferably having a carbon number of 1 to 30, more preferably from 1 to 20, still more preferably from 1 to 12, e.g., methanesulfinyl, benzenesulfinyl), a ureido group (preferably having a carbon number of 1 to 30, more preferably from 1 to 20, still more preferably from 1 to 12, e.g., ureido, methylureido, phenylureido), a phosphoric acid amido group (preferably having a carbon number of 1 to 30, more preferably from 1 to 20, still more preferably from 1 to 12, e.g., diethylphosphoric acid amido, phenylphosphoric acid amido), a hydroxyl group, a mercapto group, a halogen atom (e.g., fluorine, chlorine, bromine, iodine, with fluorine atom being preferred), a cyano group, a sulfo group, a carboxyl group, an oxo group, a nitro group, a hydroxamic acid group, a sulfino group, a hydrazino group, an imino group, a monocyclic heterocyclic group (preferably having a carbon number of 1 to 30, more preferably from 1 to 12, with the heteroatom being, for example, nitrogen atom, oxygen atom or sulfur atom; e.g., imidazolyl, pyridyl, quinolyl, furyl, thienyl, piperidyl, morpholino, benzoxazolyl, benzimidazolyl, benzothiazolyl, carbazolyl, azepinyl), a silyl group (preferably having a carbon number of 3 to 40, more preferably from 3 to 30, still more preferably from 3 to 24, e.g., trimethylsilyl, triphenylsilyl), and a silyloxy group (preferably having a carbon number of 3 to 40, more preferably from 3 to 30, still more preferably from 3 to 24, e.g., trimethylsilyloxy, triphenylsilyloxy). These substituents each may be further substituted. However, each substituent does not combine to form a condensed ring.

Formula (I) is described in detail below.

In formula (I), $Z_1$, $Z_2$, $Z_3$ and $Z_4$ each represents an atom selected from carbon, nitrogen, sulfur and oxygen and necessary for forming an unsaturated 6-membered ring skeleton together with the carbon atom to which a cyano group is bonded and the carbon atom to which $R_1$ is bonded. This atom has a hydrogen atom or a substituent, if desired. The substituent is selected from the substituent group A. In the case where the unsaturated 6-membered ring constituted including $Z_1$, $Z_2$, $Z_3$ and $Z_4$ has a plurality of substituents, these substituents may be the same or different and may be combined to form a condensed ring. $R_1$ represents a substituent, and specific examples are the same as the groups described in the substituent group A above. The bond in the unsaturated 6-membered ring indicates a single bond or a double bond.

The preferred range of formula (I) is described below. In formula (I), $Z_1$, $Z_2$, $Z_3$ and $Z_4$ each is preferably composed of carbon, nitrogen or oxygen, more preferably carbon or oxygen. A compound where the unsaturated ring constituted by $Z_1$, $Z_2$, $Z_3$ and $Z_4$ is composed of carbon or nitrogen and represents a substituted or unsubstituted benzene ring, pyridine ring, pyrazine ring, pyrimidine ring or pyridazine ring is still more preferred, and a compound where $Z_1$, $Z_2$, $Z_3$ and $Z_4$ each is composed of carbon and the unsaturated ring represents a substituted or unsubstituted benzene ring is yet still more preferred. $R_1$ is preferably an aryl group or a heterocyclic group, more preferably an aryl group. Preferred examples thereof are the same as the preferred range of the aryl group described in the substituent group A above.

The unsaturated ring including $Z_1$, $Z_2$, $Z_3$ and $Z_4$ is preferably tetra-substituted with $R_1$, more preferably tri-substituted with $R_1$ and still more preferably di-substituted with $R_1$.

Among the compounds represented by formula (I), compounds represented by formulae (II-a), (II-b) and (II-c) are preferred.

Formula (II-a) is described below. In formula (II-a), $R_2$, $R_3$, $R_4$, $R_5$, $R_6$, $R_7$, $R_8$, $R_9$ and $R_{10}$ each represents a hydrogen atom or a substituent. The substituent is selected from the substituent group A above. When $R_2$, $R_3$, $R_4$, $R_5$, $R_6$, $R_7$, $R_8$, $R_9$ and $R_{10}$ each represents a substituent, the substituent may further have a substituent. The pairs of $R_2$ and $R_3$, $R_3$ and $R_4$, $R_4$ and $R_5$, $R_5$ and $R_6$, $R_6$ and $R_7$, $R_7$ and $R_8$, $R_8$ and $R_9$, and $R_9$ and $R_{10}$ each may combine to form a ring. $R_2$, $R_3$, $R_4$, $R_5$, $R_6$, $R_7$, $R_8$, $R_9$ and $R_{10}$ each is preferably a hydrogen atom, an alkyl group, a cycloalkyl group, an alkenyl group, an alkynyl group, an aryl group, an amino group, an alkoxy group, an aryloxy group, a heterocyclic oxy group, an acyl group, an alkylthio group, an arylthio group, a heterocyclic thio group, a sulfonyl group, a hydroxy group, a mercapto group, a halogen atom, a cyano group, a nitro group, a heterocyclic group or a silyl group, more preferably a hydrogen atom, an alkyl group, a cycloalkyl group, an aryl group, an aryloxy group, a halogen atom, a cyano group, a heterocyclic group, a silyl group or a nitro group still more preferably a hydrogen atom, an alkyl group, an aryl group, a halogen atom, a cyano group, a heterocyclic group or a nitro group. These substituents each may be further substituted.

Among $R_2$, $R_3$, $R_4$ and $R_5$ in formula (II-a), preferably any three of $R_2$, $R_3$, $R_4$, $R_5$ represent substituents, more preferably any two of $R_2$, $R_3$, $R_4$, $R_5$ represent substituents and still more preferably any one of $R_2$, $R_3$, $R_4$, $R_5$ represents a substituent.

Formula (II-b) is described below. In formula (II-b), $X_1$, $X_2$, $X_3$ and $X_4$ each represents an atomic group selected from carbon and nitrogen and necessary for forming an unsaturated heterocyclic skeleton together with the carbon atom. The unsaturated ring constituted by the carbon atom, $X_1$, $X_2$, $X_3$ and $X_4$ has a hydrogen atom or a substituent, if desired. The substituent is selected from the substituent group A above. The bond in the unsaturated heterocyclic ring indicates a single bond or a double bond.

In formula (II-b), a compound where $X_1$, $X_2$, $X_3$ and $X_4$ each is composed of carbon or nitrogen and the unsaturated ring represents a pyridine ring, a pyridine ring, a pyrazine ring or a pyridazine ring is preferred, a compound where the unsaturated ring represents a pyridine ring, a pyrimidine ring or a pyrazine ring is more preferred, and a compound where the unsaturated ring constituted by the carbon atom, $X_1$, $X_2$, $X_3$ and $X_4$ is composed of carbon or nitrogen atom and represents a substituted or unsubstituted pyridine ring is still more preferred. $R_6$, $R_7$, $R_8$, $R_9$ and $R_{10}$ have the same meanings as $R_6$, $R_7$, $R_8$, $R_9$ and $R_{10}$ in formula (II-a), and preferred ranges thereof are also the same.

Formula (II-c) is described below. In formula (II-c), $Q_2$ represents an atomic group selected from carbon, nitrogen, sulfur and oxygen and necessary for forming an unsaturated heterocyclic skeleton together with the carbon atom. The unsaturated heterocyclic ring constituted by the carbon atom and $Q_2$ has a hydrogen atom or a substituent, if desired. The substituent is selected from the substituent group A above. The bond in the unsaturated heterocyclic ring indicates a single bond or a double bond.

In formula (II-c), a compound where $Q_2$ is composed of carbon, nitrogen or oxygen is preferred, a compound where $Q_2$ is composed of carbon or nitrogen and the unsaturated ring is a 5- or 6-membered heterocyclic ring is more preferred, and a compound where $Q_2$ is composed of carbon and nitrogen and the unsaturated ring is a pyridine ring, a pyrimidine ring, a pyrazine ring, a pyridazine ring, a pyrazole ring or an imidazole ring is still more preferred. $R_2$, $R_3$, $R_4$ and $R_5$ have the same meanings as $R_2$, $R_3$, $R_4$ and $R_5$ in formula (II-a), and preferred ranges thereof are also the same.

The compound of formula (II-a) is preferably a compound represented by formula (III). Formula (III) is described below.

In formula (III), $R_{11}$, $R_{12}$, $R_{13}$, $R_{14}$ and $R_{15}$ each represents a hydrogen atom or a substituent. The substituent is selected from the substituent group A above. When $R_{11}$, $R_{12}$, $R_{13}$, $R_{14}$ and $R_{15}$ each represents a substituent, the substituent may further have a substituent. The pairs of $R_3$ and $R_{15}$, $R_{11}$ and $R_{12}$, $R_{12}$ and $R_{13}$, $R_{13}$ and $R_{14}$, and $R_{14}$ and $R_{15}$ each may combine to form a ring. $R_{11}$, $R_{12}$, $R_{13}$, $R_{14}$ and $R_{15}$ each is preferably a hydrogen atom, an alkyl group, a cycloalkyl group, an alkenyl group, an alkynyl group, an aryl group, an amino group, an alkoxy group, an aryloxy group, a heterocyclic oxy group, an acyl group, an alkylthio group, a heterocyclic thio group, a sulfonyl group, a hydroxy group, a mercapto group, a halogen atom, a cyano group, a nitro group, a heterocyclic group or a silyl group, more preferably a hydrogen atom, an alkyl group, an aryl group, a halogen atom, a cyano group, a heterocyclic group or a nitro group, still more preferably a hydrogen atom, an alkyl group, an aryl group, a cyano group, a heterocyclic group or a nitro group. These substituents each may be further substituted. $R_3$, $R_4$, $R_5$, $R_6$, $R_7$, $R_8$, $R_9$ and $R_{10}$ have the same meanings as $R_3$, $R_4$, $R_5$, $R_6$, $R_7$, $R_8$, $R_9$ and $R_{10}$ in formula (II), and preferred ranges thereof are also the same.

Among $R_3$, $R_4$ and $R_5$ in formula (III), preferably any two of $R_3$, $R_4$ and $R_5$ represent substituents and more preferably any one of $R_3$, $R_4$ and $R_5$ represents a substituent.

The compound of formula (II-a) is more preferably a compound represented by formula (IV). Formula (IV) is described below.

In formula (IV), $R_{16}$, $R_{17}$, $R_{18}$, $R_{19}$, $R_{20}$, $R_{21}$, $R_{22}$, $R_{23}$, $R_{24}$ and $R_{25}$ each represents a hydrogen atom or a substituent. The substituent is selected from the substituent group A above. When $R_{16}$, $R_{17}$, $R_{18}$, $R_{19}$, $R_{20}$, $R_{21}$, $R_{22}$, $R_{23}$, $R_{24}$ and $R_{25}$ each represents a substituent, the substituent may further have a substituent. The pairs of $R_{14}$ and $R_{16}$, $R_7$ and $R_{25}$, $R_{16}$ and $R_{17}$, $R_{17}$ and $R_{18}$, $R_{18}$ and $R_{19}$, $R_{19}$ and $R_{20}$, $R_{21}$ and $R_{22}$, $R_{22}$ and $R_{23}$, $R_{23}$ and $R_{24}$, and $R_{24}$ and $R_{25}$ each may combine to form a ring. $R_{16}$, $R_{17}$, $R_{18}$, $R_{19}$, $R_{20}$, $R_{21}$, $R_{22}$, $R_{23}$, $R_{24}$ and $R_{25}$ each is preferably a hydrogen atom, an alkyl group, a cycloalkyl group, an aryl group, an alkoxy group, an aryloxy group, a halogen atom, a cyano group, a heterocyclic group or a silyl group, more preferably a hydrogen atom, an alkyl group, an aryl group, a halogen atom, a cyano group or a heterocyclic group, still more preferably a hydrogen atom, an alkyl group, an aryl group, a cyano group or a heterocyclic group, yet still more preferably a hydrogen atom or an aryl group. These substituents each may be further substituted. $R_3$, $R_4$, $R_5$, $R_7$, $R_8$, $R_9$ and $R_{10}$ have the same meanings as $R_3$, $R_4$, $R_5$, $R_7$, $R_8$, $R_9$ and $R_{10}$ in formula (III). $R_{11}$, $R_{12}$, $R_{13}$ and $R_{14}$ have the same meanings as $R_{11}$, $R_{12}$, $R_{13}$ and $R_{14}$ in formula (III), and preferred ranges thereof are also the same.

Among $R_3$, $R_4$ and $R_5$ in formula (IV), preferably any two of $R_3$, $R_4$ and $R_5$ represent substituents and more preferably any one of $R_3$, $R_4$ and $R_5$ represents a substituent.

The compound of formula (II-a) is more preferably a compound represented by formula (V). Formula (V) is described below.

In formula (V), $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a hydrogen atom or a substituent. The substituent is selected from the substituent group A above.

$R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each is preferably a hydrogen atom, an alkyl group, a cycloalkyl group, an aryl group, an alkoxy group, an aryloxy group, a halogen atom, a cyano group, a heterocyclic group or a silyl group, more preferably a hydrogen atom, an alkyl group, an aryl group, a cyano group or a heterocyclic group, still more preferably a hydrogen atom, an alkyl group or a heterocyclic group. When $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a substituent, the substituent may further have a substituent. The pairs of $R_{26}$ and $R_{27}$, $R_{26}$ and $R_{43}$, $R_{26}$ and $R_{39}$, $R_{27}$ and $R_{28}$, $R_{28}$ and $R_{29}$, $R_{30}$ and $R_{31}$, $R_{31}$ and $R_{32}$, $R_{32}$ and $R_{33}$, $R_{33}$ and $R_{34}$, $R_{33}$ and $R_{38}$, $R_{34}$ and $R_{35}$, $R_{35}$ and $R_{36}$, $R_{36}$ and $R_{37}$, $R_{37}$ and $R_{38}$, $R_{39}$ and $R_{40}$, $R_{40}$ and $R_{41}$, $R_{41}$ and $R_{42}$, and $R_{42}$ and $R_{43}$, each does not combine with each other to form a condensed ring.

$R_4$ has the same meaning as $R_4$ in formula (III), and preferred range thereof is also the same.

The compound of formula (II-a) is more preferably a compound represented by formula (VI). Formula (VI) is described below.

In formula (VI), $R_{44}$, $R_{45}$, $R_{48}$ and $R_{49}$ each represents a hydrogen atom or a substituent. The substituent is selected from the substituent group A above. The substituent is not a condensed ring. When $R_{44}$, $R_{45}$, $R_{48}$ and $R_{49}$ each represents a substituent, the substituent may further have a substituent, and the pairs of $R_{44}$ and $R_{45}$, and $R_{48}$ and $R_{49}$ each may combine to form a ring. $R_{44}$, $R_{45}$, $R_{48}$ and $R_{49}$ each is preferably a hydrogen atom, an alkyl group, a cycloalkyl group, an aryl group or a heterocyclic group, more preferably an alkyl group, an aryl group or a heterocyclic group, still more preferably an aryl group and particularly more preferably an aryl group in which $R_{44}$ and $R_{45}$, and $R_{48}$ and $R_{49}$, are combined with each other respectively to form a carbazole ring together with a nitrogen atom. $R_{46}$ and $R_{47}$ each represents a hydrogen atom or a substituent. When $R_{46}$ and $R_{47}$ each represents a substituent, the substituent may further have a substituent. $R_{46}$ and $R_{47}$ each is preferably a hydrogen atom, an alkyl group, an aryl group or a heterocyclic group, more preferably a hydrogen atom, an alkyl group or an aryl group, still more preferably a hydrogen atom or an aryl group. Provided that, when $R_{27}$, $R_{28}$, $R_{29}$, $R_{30}$, $R_{31}$, $R_{32}$, $R_{46}$ and $R_{47}$ each represents a substituent, the pairs of $R_{32}$ and $R_{44}$, $R_{32}$ and $R_{45}$, $R_{44}$ and $R_{46}$, $R_{45}$ and $R_{46}$, $R_{47}$ and $R_{48}$, $R_{47}$ and $R_{49}$, $R_{49}$ and $R_{27}$, and $R_{27}$ and $R_{48}$, each does not combine to form a condensed ring. $R_4$ has the same meaning as $R_4$ in formula (III), and preferred range thereof is also the same. $R_{27}$, $R_{28}$, $R_{29}$, $R_{30}$, $R_{31}$ and $R_{32}$ have the same meanings as $R_{27}$, $R_{28}$, $R_{29}$, $R_{30}$, $R_{31}$ and $R_{32}$ in formula (V) (namely, $R_{27}$, $R_{28}$, $R_{29}$, $R_{30}$, $R_{31}$ and $R_{32}$ each represents a hydrogen atom or a substituent, and when $R_{27}$, $R_{28}$, $R_{29}$, $R_{30}$, $R_{31}$ and $R_{32}$ each represents a substituent, the substituent may further have a substituent, but the pairs of $R_{27}$ and $R_{28}$, $R_{28}$ and $R_{29}$, $R_{30}$ and $R_{31}$, $R_{31}$ and $R_{32}$, $R_{27}$ and $R_{48}$, $R_{27}$ and $R_{49}$, $R_{32}$ and $R_{44}$, $R_{32}$ and $R_{45}$, $R_{47}$ and $R_{48}$, $R_{47}$ and $R_{49}$, $R_{46}$ and $R_{44}$, and $R_{46}$ and $R_{45}$, each does not combine to form a condensed ring), and preferred ranges thereof are also the same.

The compound of formula (II-a) is more preferably a compound represented by formula (VII). Formula (VII) is described below.

In formula (VII), $R_{50}$, $R_{51}$, $R_{52}$, $R_{53}$ and $R_{54}$ each represents a hydrogen atom or a substituent. The substituent is selected from the substituent group A above. The substituent is not a condensed ring. $R_{50}$, $R_{51}$, $R_{52}$, $R_{53}$ and $R_{54}$ each is preferably a hydrogen atom, an alkyl group, a cycloalkyl group, an aryl group, an alkoxy group, an aryloxy group, a halogen atom, a cyano group, a heterocyclic group or a silyl group, more preferably a hydrogen atom, an alkyl group, an aryl group, a cyano group or a heterocyclic group, still more preferably a hydrogen atom, an alkyl group or a heterocyclic group. When $R_{50}$, $R_{51}$, $R_{52}$, $R_{53}$ and $R_{54}$ each represents a substituent, the substituent may further have a substituent, and the pairs of $R_{50}$ and $R_{51}$, $R_{51}$ and $R_{52}$, $R_{52}$ and $R_{53}$, and $R_{53}$ and $R_{54}$, each does not combine to form a condensed ring. $R_{26}$, $R_{27}$, $R_{28}$, $R_{29}$, $R_{30}$, $R_{31}$, $R_{32}$ and $R_{33}$ have the same meanings as $R_{26}$, $R_{27}$, $R_{28}$, $R_{29}$, $R_{30}$, $R_{31}$, $R_{32}$ and $R_{33}$ in formula (V) (namely, $R_{26}$, $R_{27}$, $R_{28}$, $R_{29}$, $R_{30}$, $R_{31}$, $R_{32}$ and $R_{33}$ each represents a hydrogen atom or a substituent, when $R_{26}$, $R_{27}$, $R_{28}$, $R_{29}$, $R_{30}$, $R_{31}$, $R_{32}$ and $R_{33}$ each represents a substituent, the substituent may further have a substituent, but the pairs of $R_{26}$ and $R_{27}$, $R_{27}$ and $R_{28}$, $R_{28}$ and $R_{29}$, $R_{30}$ and $R_{31}$, $R_{31}$ and $R_{32}$, and $R_{32}$ and $R_{33}$, each does not combine to form a condensed ring), and preferred ranges thereof are also the same. $R_{46}$ and $R_{47}$ have the same meanings as $R_{46}$ and $R_{47}$ in formula (VI). (Namely, $R_{46}$ and $R_{47}$ each represents a hydrogen atom or a substituent. When $R_{46}$ and $R_{47}$ each represents a substituent, the substituent may further have a substituent, but the pairs of $R_{46}$ and $R_{33}$, and $R_{47}$ and $R_{26}$, each does not combine to form a condensed ring.) Preferred ranges of $R_{46}$ and $R_{47}$ are the same as those of $R_{46}$ and $R_{47}$ in formula (VI).

The compound of the present invention may be not only a low molecular compound but also an oligomer compound or a polymer compound (the weight average molecular weight (in terms of polystyrene) is preferably from 1,000 to 5,000,000, more preferably from 2,000 to 1,000,000, still more preferably from 3,000 to 100,000). In the case of a polymer compound, the structure represented by formula (1) may be contained in the polymer main chain or may be contained in the polymer side chain. Also, the polymer compound may be a homopolymer compound or a copolymer. The compound of the present invention is preferably a low molecular compound.

The lowest excited triplet energy level (hereinafter, sometimes simply referred to as "$T_1$") of the compound of the present invention is preferably from 65 kcal/mol (272.35 kJ/mol) to 95 kcal/mol (398.05 kJ/mol), more preferably from 65 kcal/mol (272.35 kJ/mol) to 80 kcal/mol (335.2 kJ/mol), still more preferably from 65 kcal/mol (272.35 kJ/mol) to 75 kcal/mol (314.3 kJ/mol), yet still more preferably from 65 kcal/mol (272.35 kJ/mol) to 70 kcal/mol (293.3 kJ/mol).

The lowest excited triplet energy level of a compound is described in detail, for example, in Haruo Inoue, Katsuhiko Takagi, Masako Sasaki and Chong-Jeon Pak, Hikarikagaku I (Photochemistry I), pp. 34-38, Maruzen (1999) and Katsuki Tokumaru, Hikarikagaku no Sekai (World of Photochemistry), pp. 48-54, Dainippon Tosho (1993), and can be calculated by the methods or the like described therein.

Also, the relationship of the highest occupied molecular orbital (HOMO), lowest unoccupied molecular orbital (LUMO), ionization potential and electron affinity of a compound with the light emission principle of an organic electroluminescent device is described in detail in publications such as Seishi Tokito, Chihaya Adachi and Hideyuki Murata, Yuki EL Display (Organic EL Display), pp. 17-32, Ohm Sha (2004).

In view of vapor-deposition property, thermal stability, amorphous film and suppression of crystallization, the compound of the present invention preferably has a glass transition temperature (hereinafter simply referred to as "Tg") of 110 to 400° C., more preferably from 140 to 350° C., still more preferably from 150 to 300° C.

Specific examples of the compound of the present invention are set forth below, but the present invention is not limited thereto.

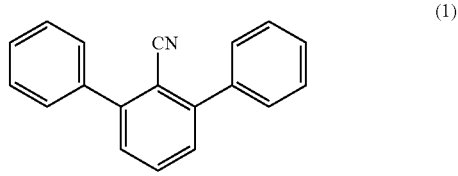

(1)

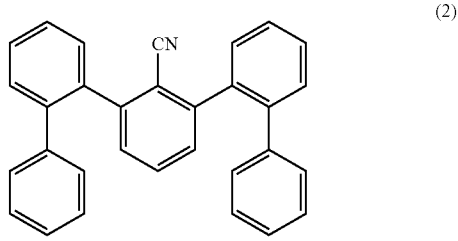

(2)

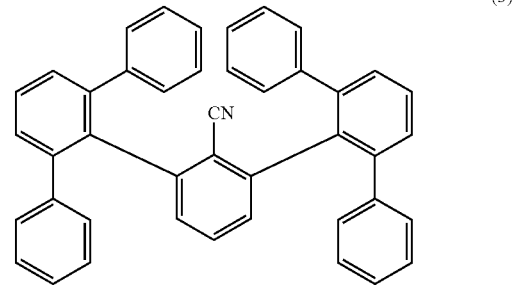

(3)

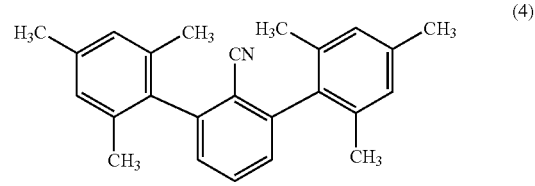

(4)

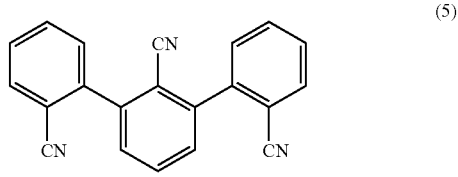

(5)

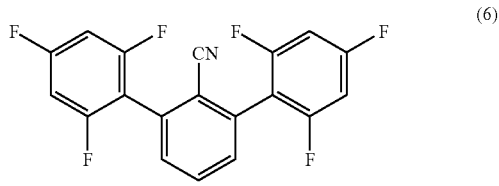

(6)

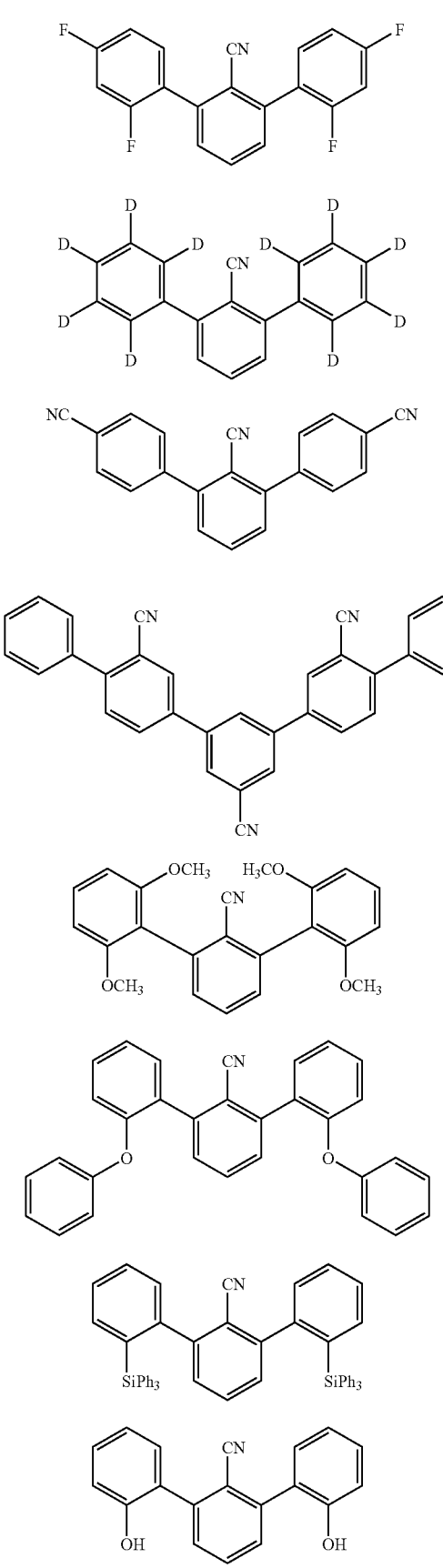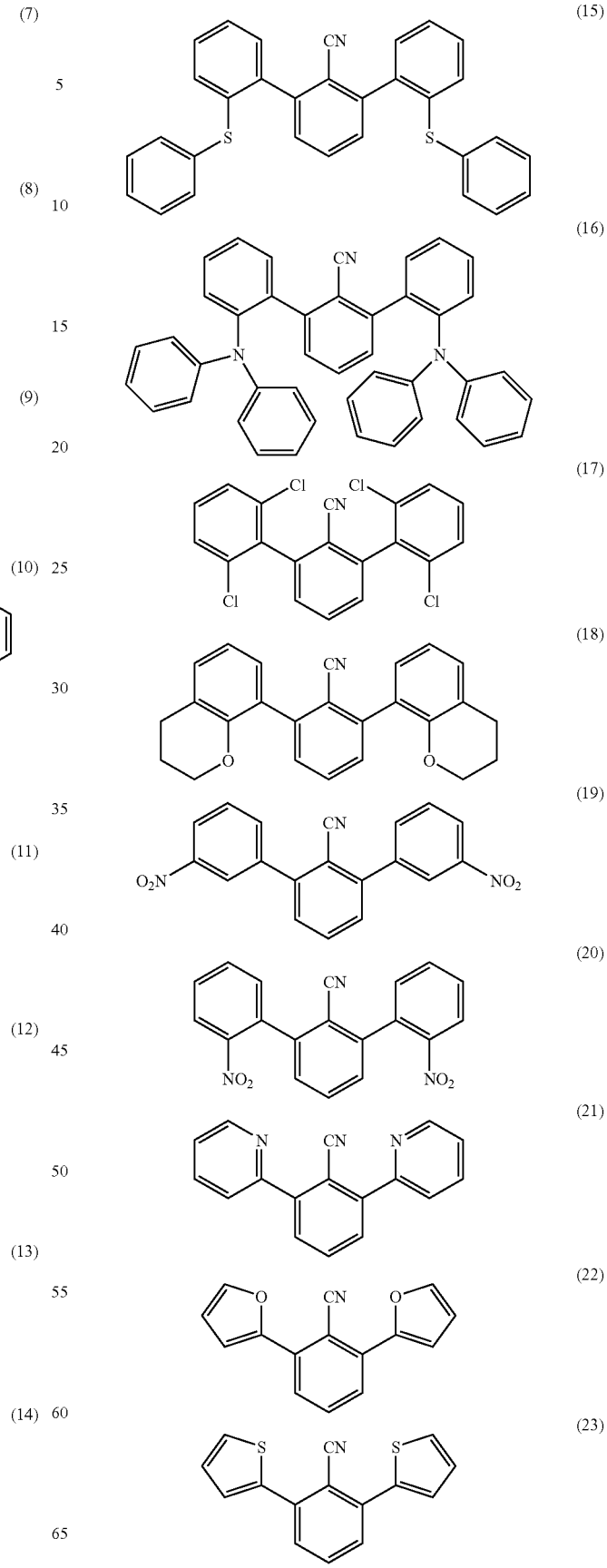

-continued
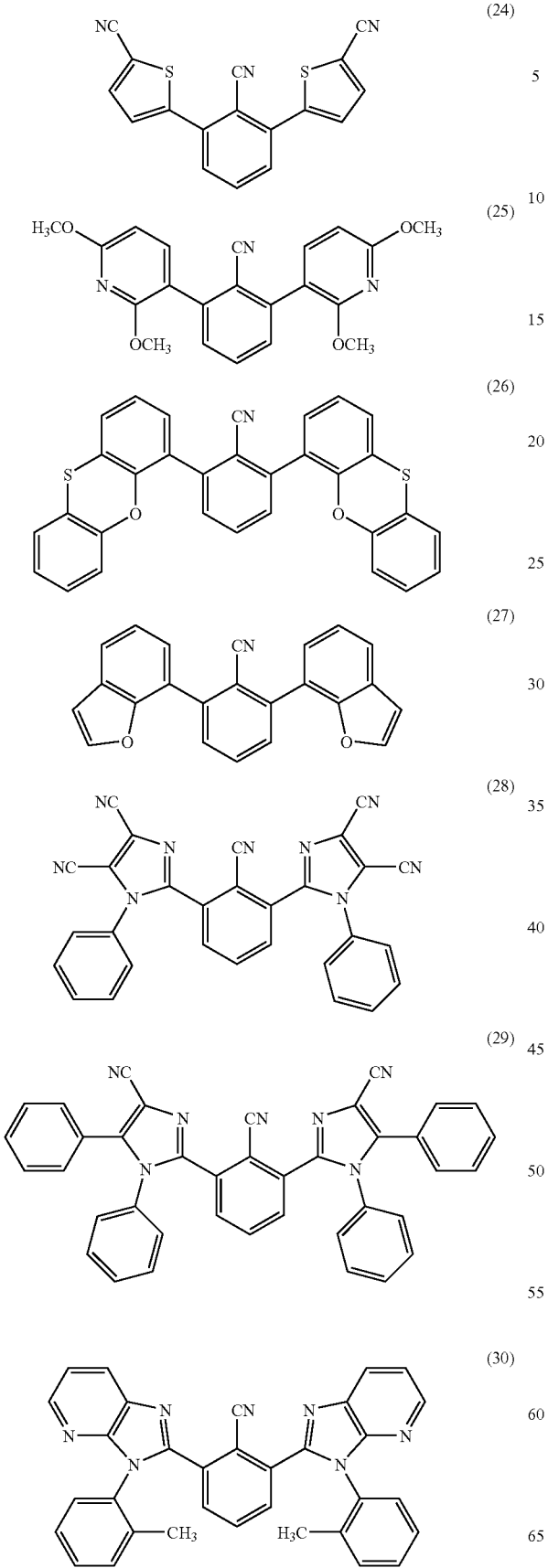
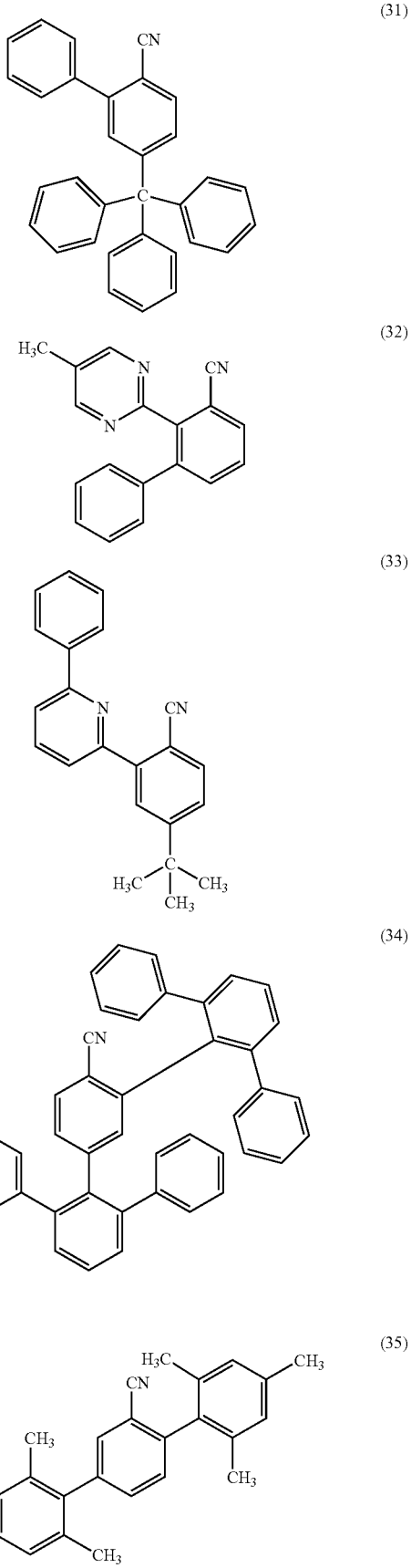

(36)
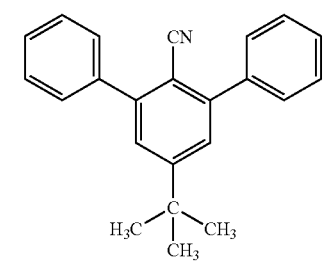
(37)
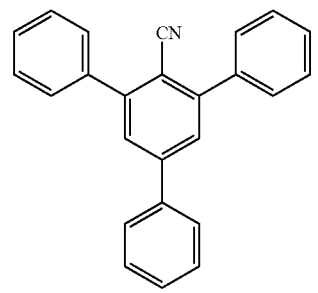
(38)
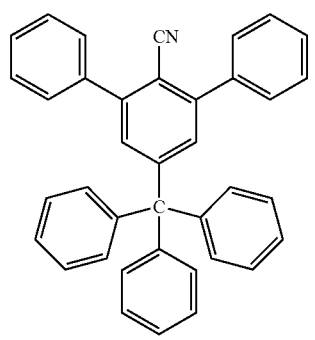
(39)
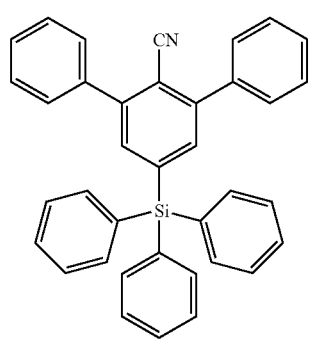
(40)
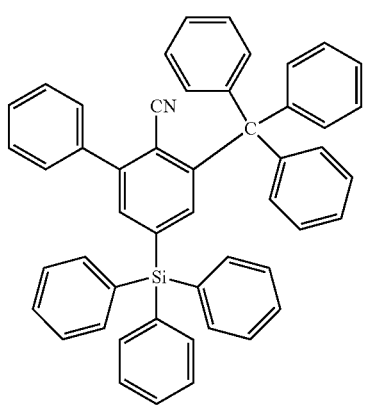
(41)
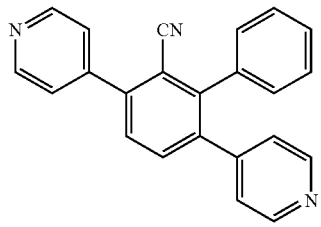
(42)
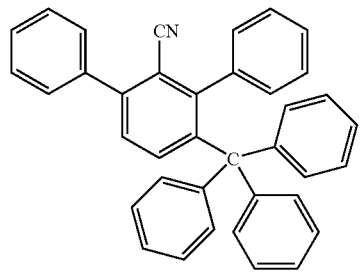
(43)
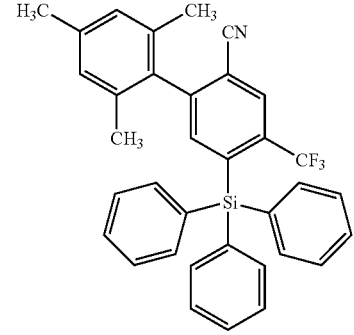
(44)
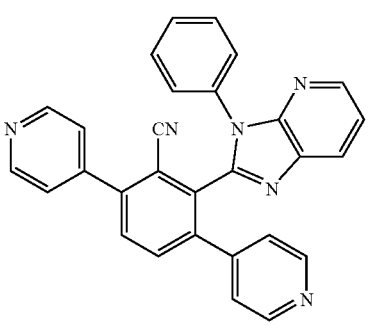
(45)

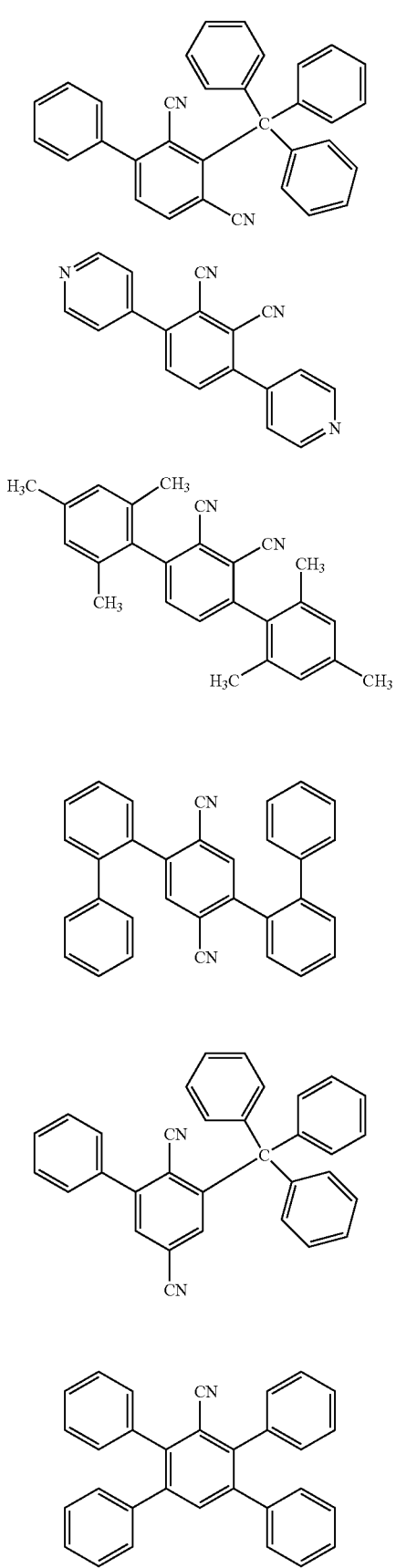

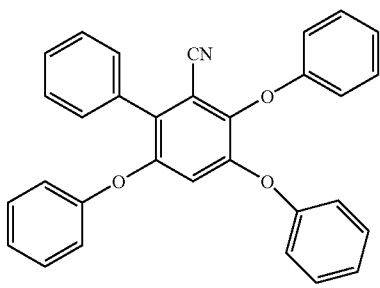
(57)
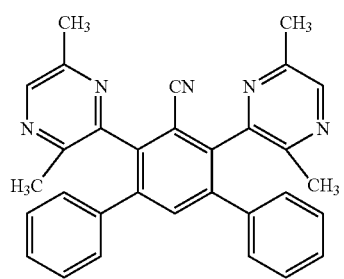
(58)
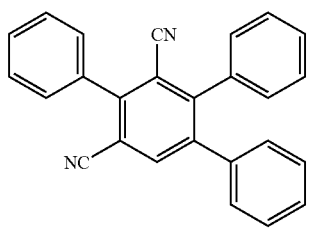
(59)
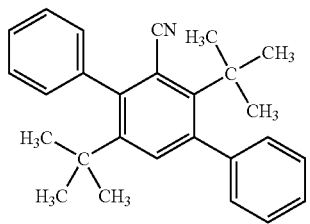
(60)
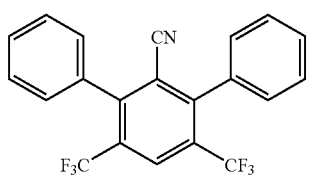
(61)
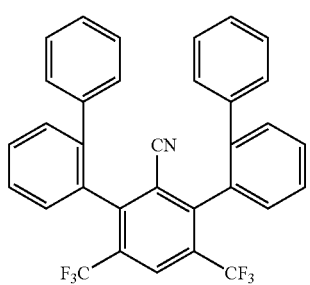
(62)
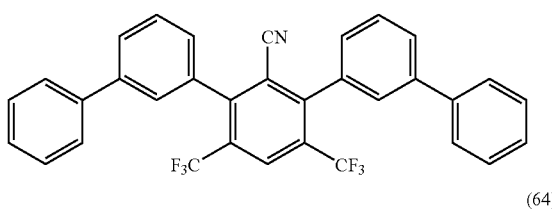
(63)
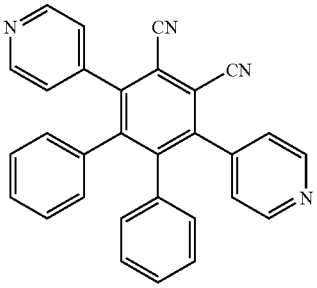
(64)
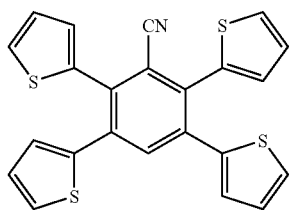
(65)
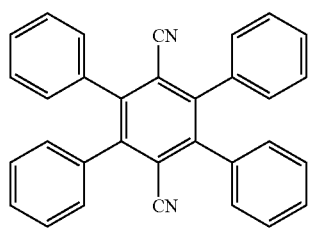
(66)
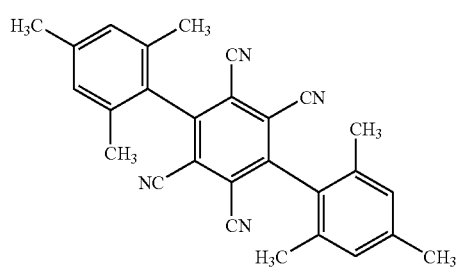
(67)
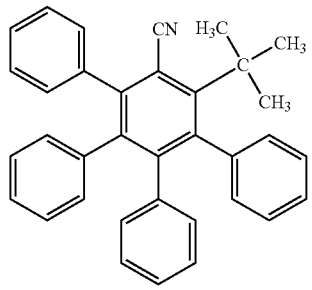
(68)

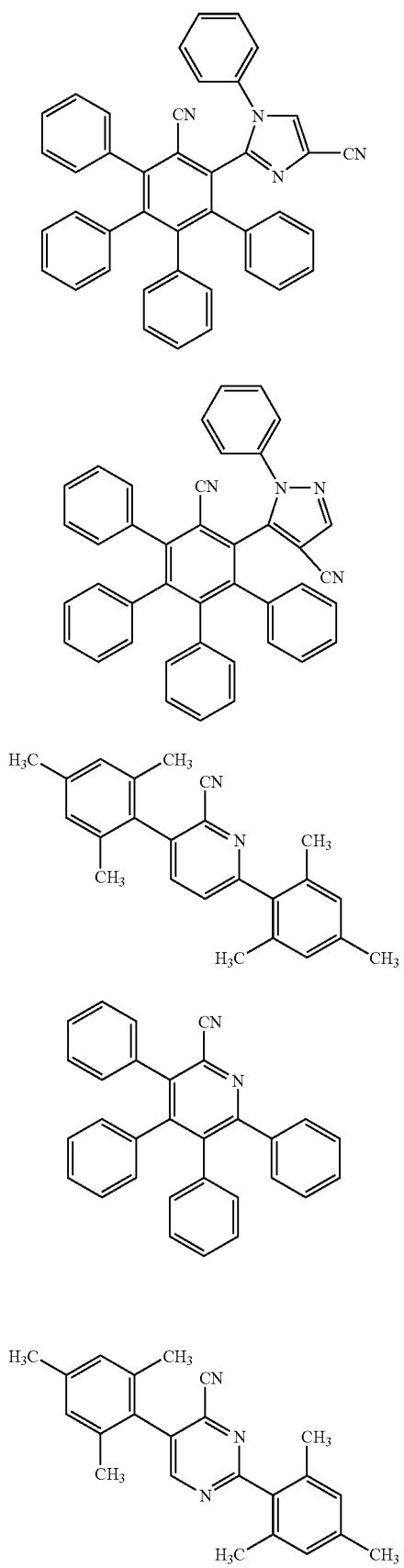
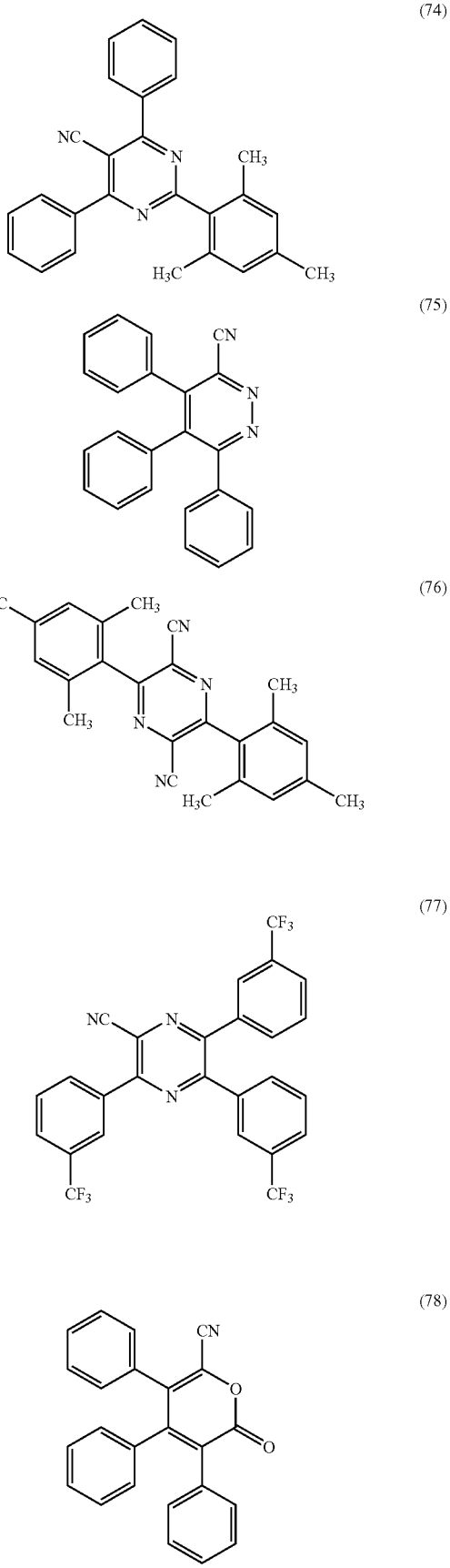

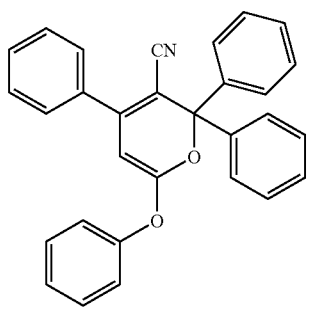
(79)
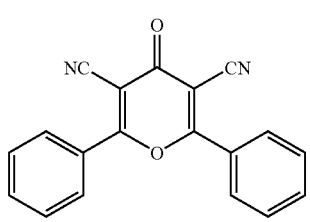
(80)
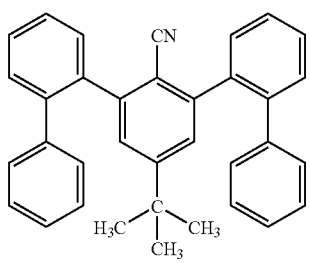
(81)
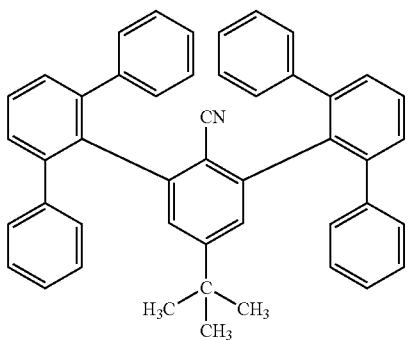
(82)
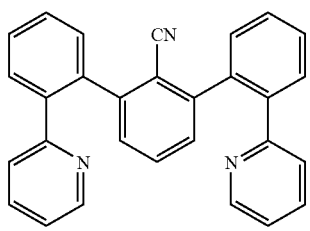
(83)
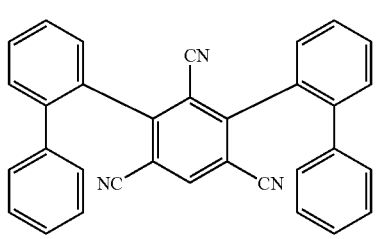
(84)
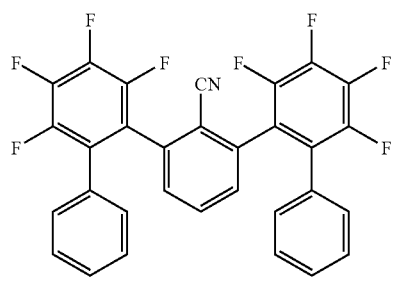
(85)
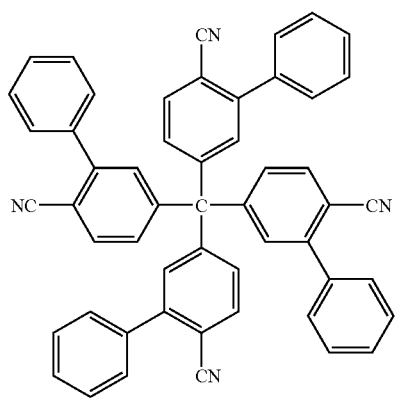
(86)
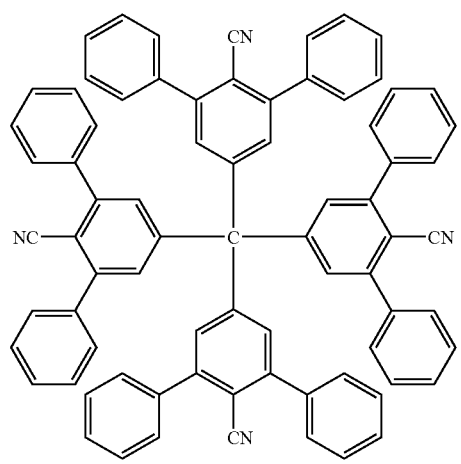
(87)
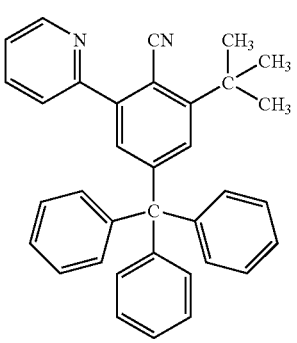
(88)

(89)
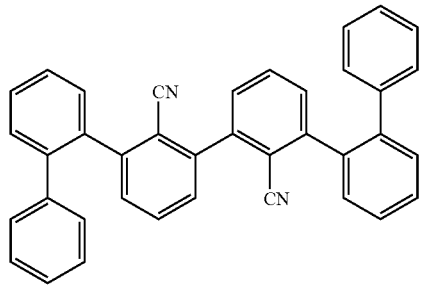
(90)
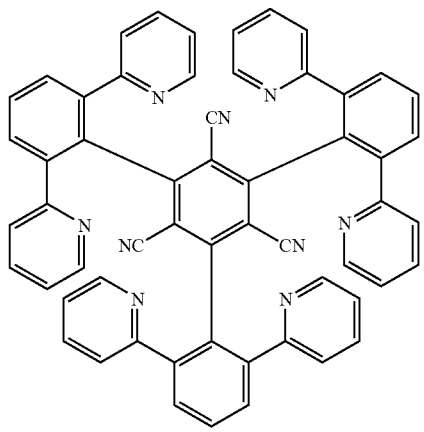
(91)
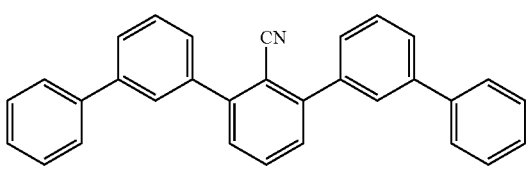
(92)
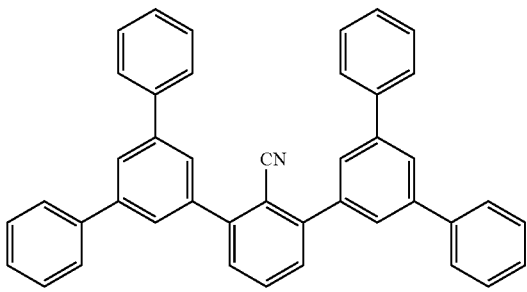
(93)
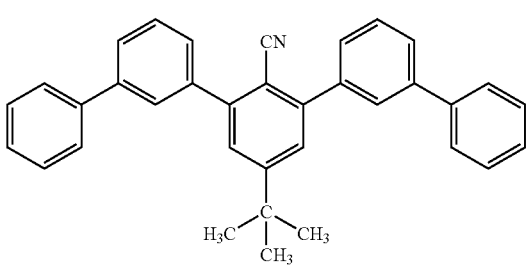
(94)
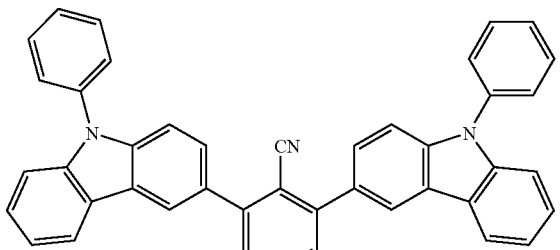
(95)
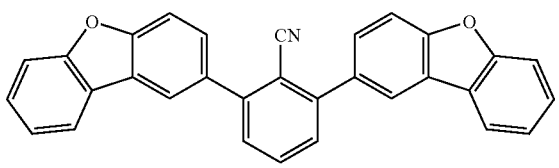
(96)
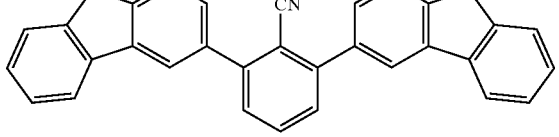
(97)
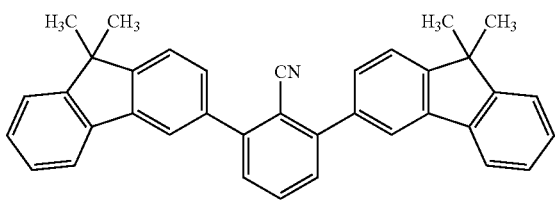
(98)
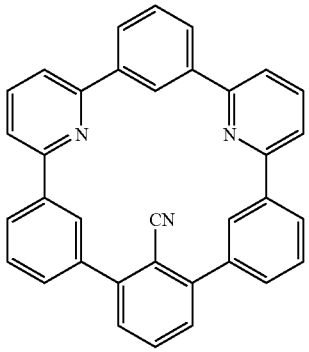
(99)
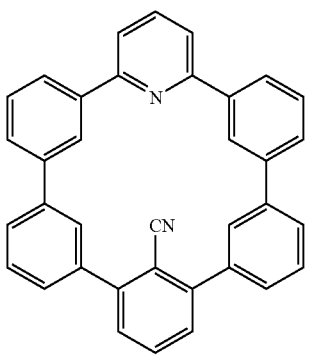

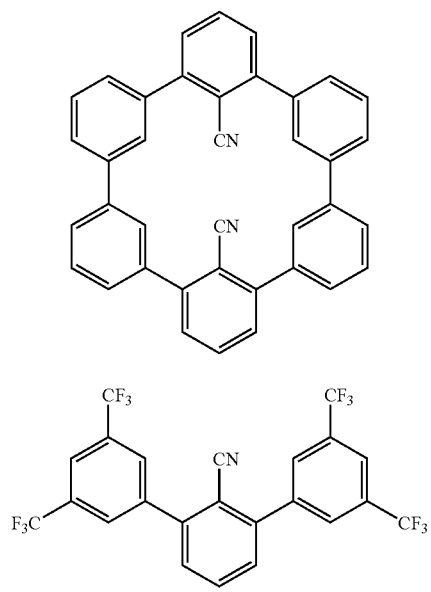
(100)
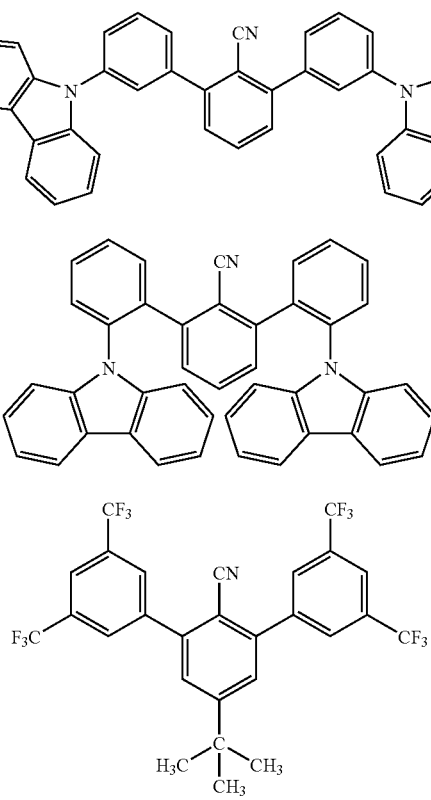
(101)
(102)
(103)
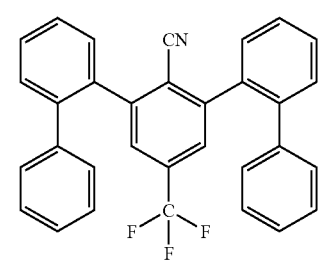
(104)
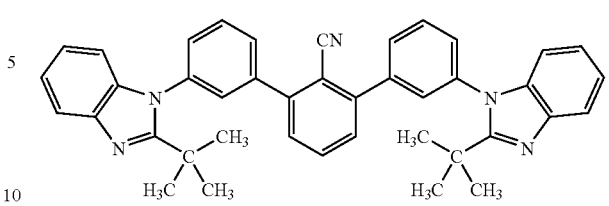
(105)
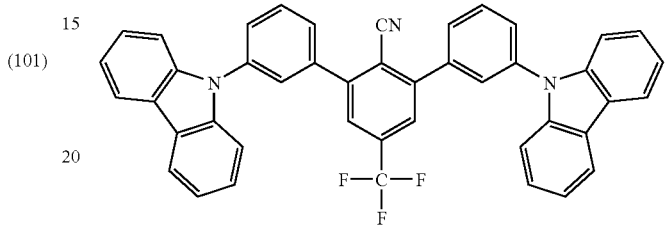
(106)
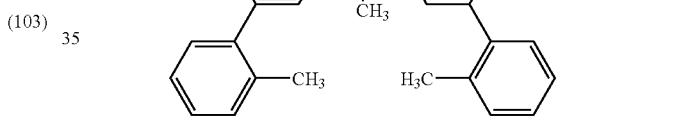
(107)
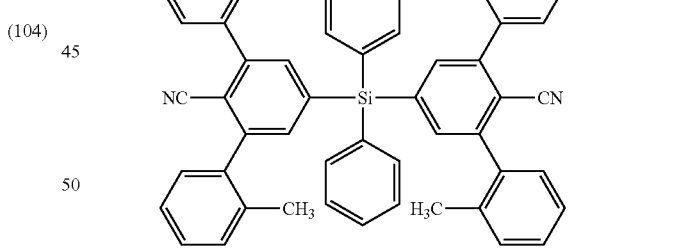
(108)
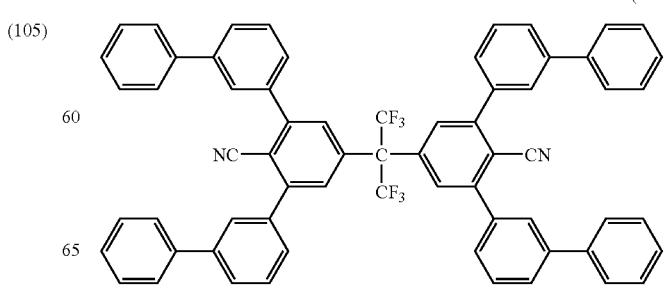
(109)
(110)

-continued
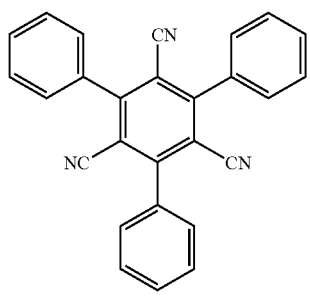
(111)
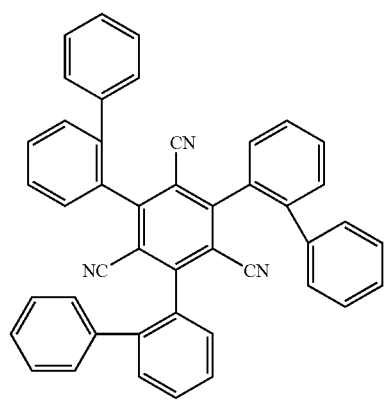
(112)
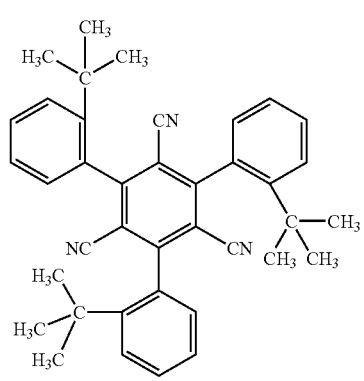
(113)
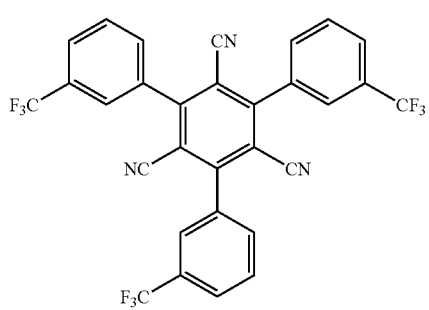
(114)
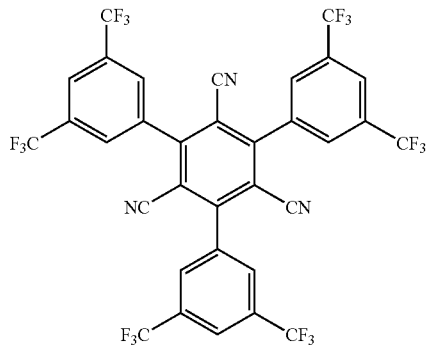
(115)
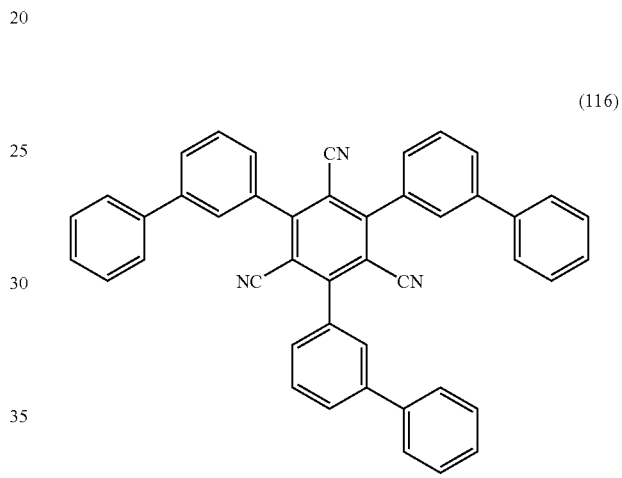
(116)
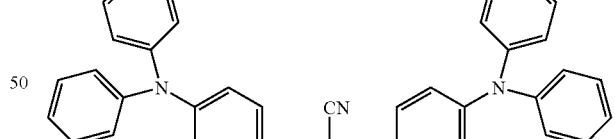
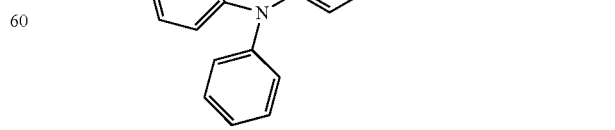
(117)

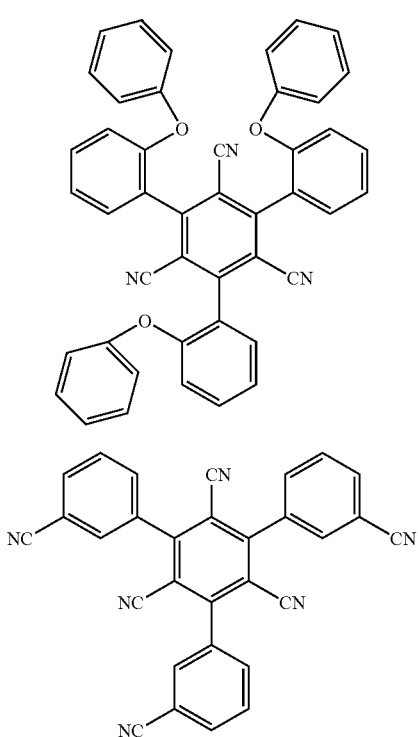

(118)

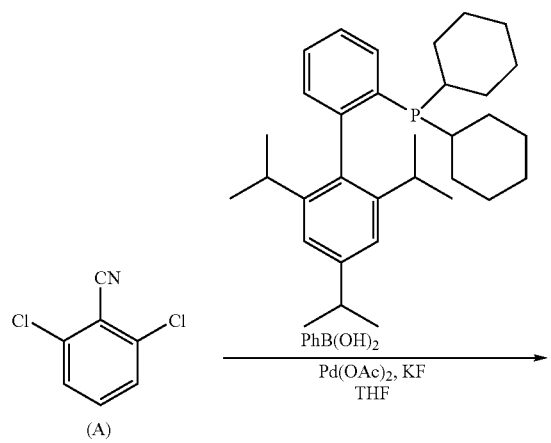

(119)

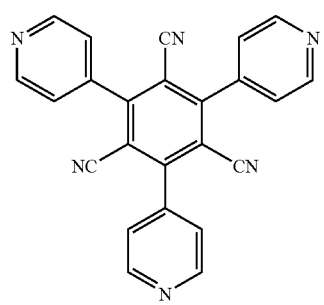

(120)

The compound of the present invention can be synthesized by referring to the methods described, for example, in Angewante Chemie International Edition in English, 38(16), 2413-2416 (1999) or Journal of the American Chemical Society, 122(17), 4020-4028 (2000), but the present invention is not limited to the methods described therein.

Out of the compounds of the present invention, specific synthesis examples of Compounds (1), (2), (19), (91), (101), (102), (107) and (111) are described below, but the present invention is not limited to these methods.

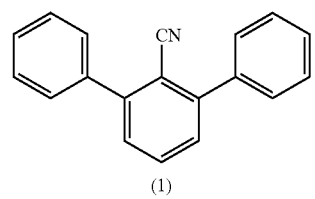

(1)

-continued
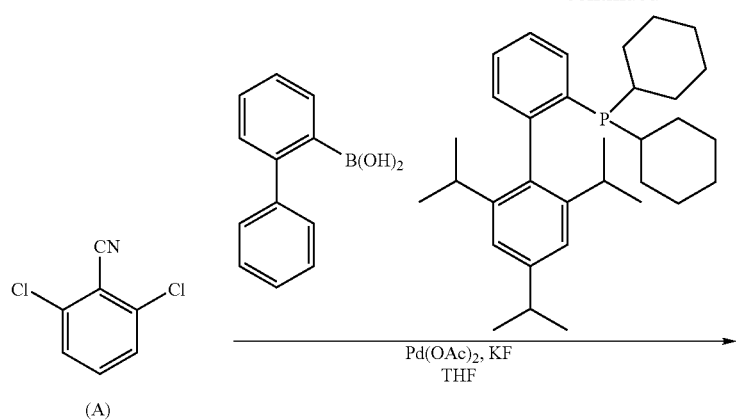
(A)
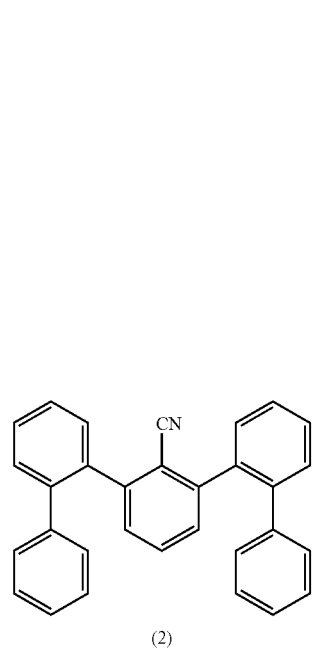
(2)
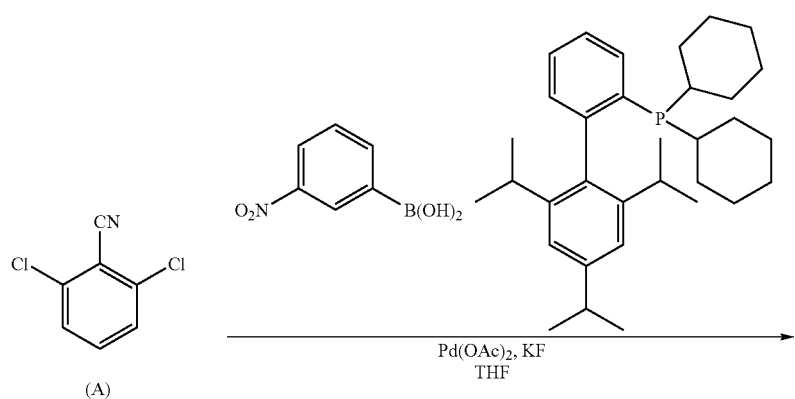
(A)
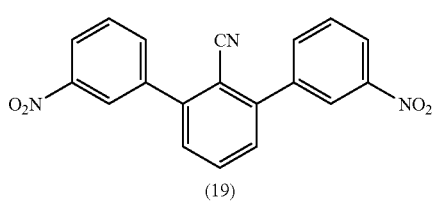
(19)
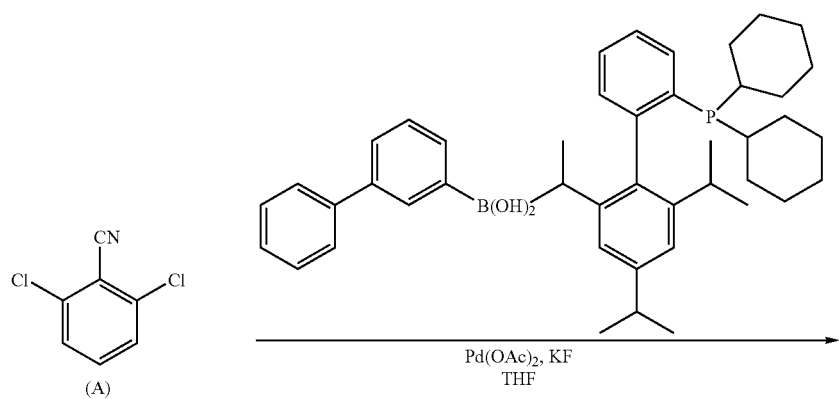
(A)

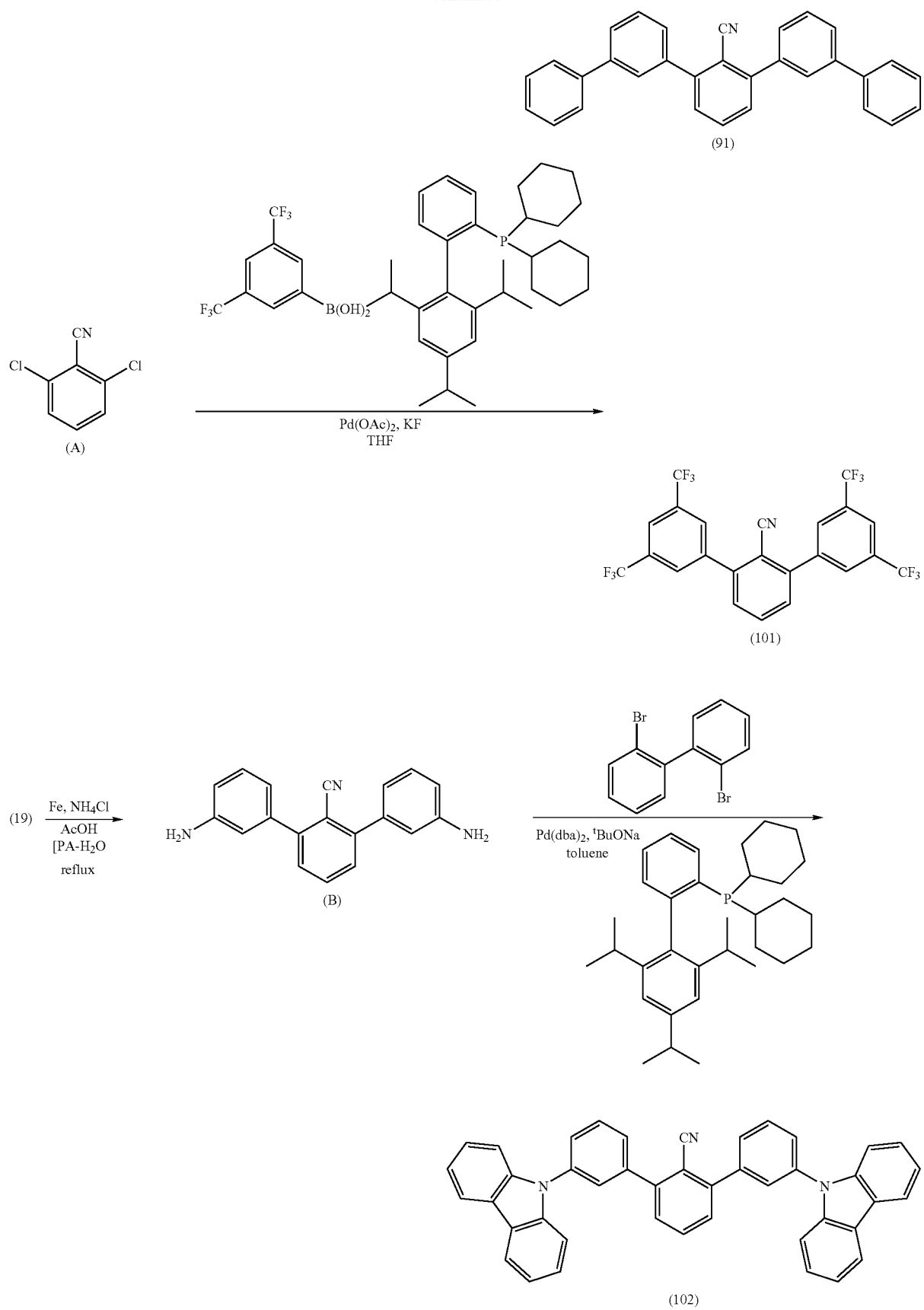

-continued
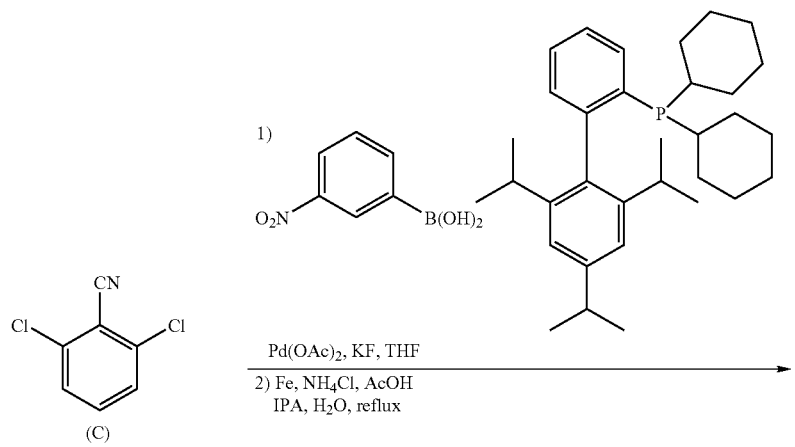
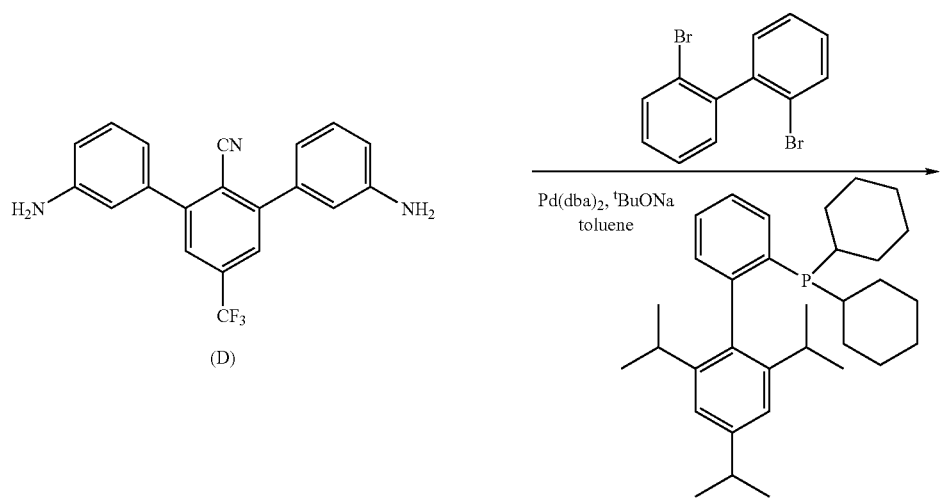
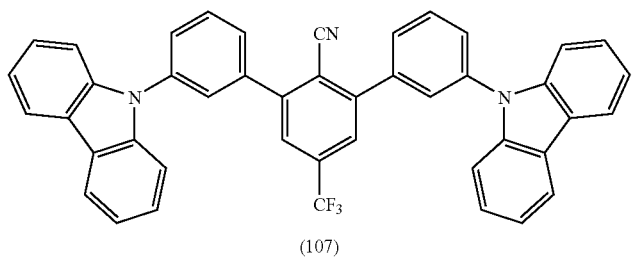
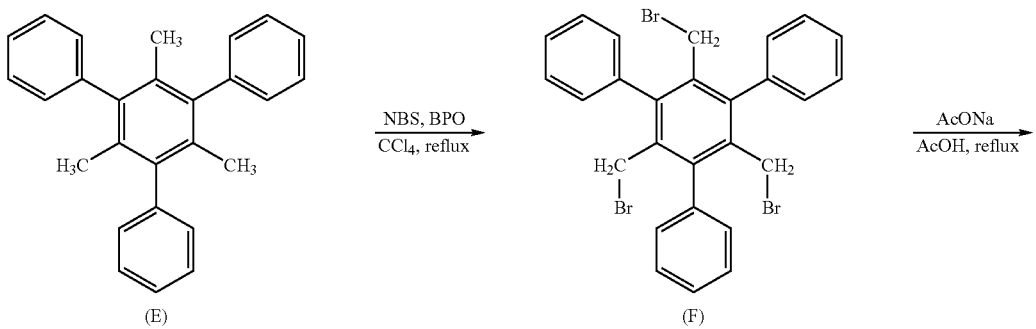

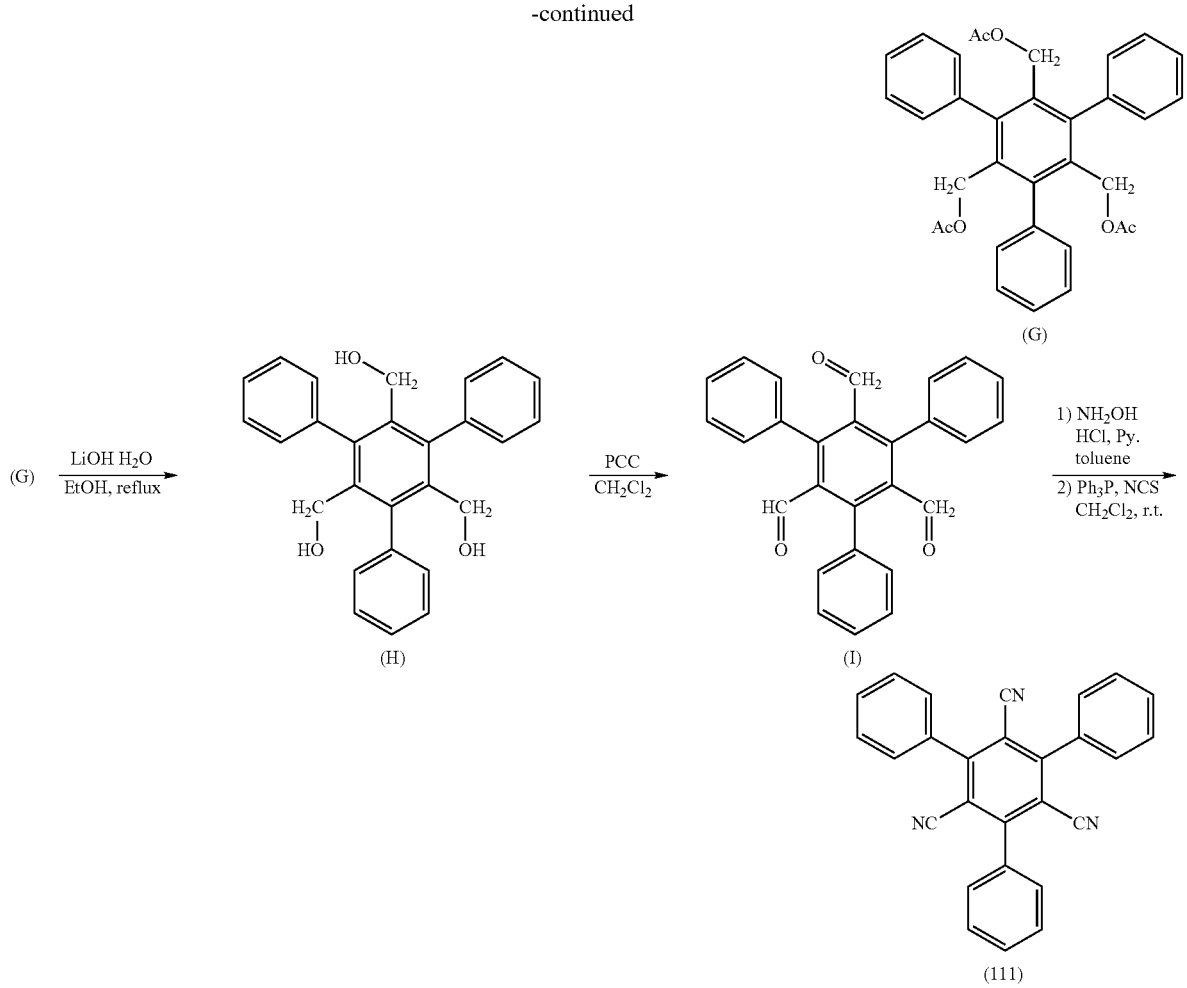

<Synthesis of Compound (1)>

In a 300 mL-volume three-necked flask, 5.16 g (30.0 mmol) of Compound (A), 7.70 g (63.1 mmol) of phenylboric acid, 10.5 g (180 mmol) of potassium fluoride and 52 ml of THF were added and while stirring the mixture at room temperature, 0.13 g (0.58 mmol) of palladium acetate and 0.43 g (0.90 mmol) of 2-dicyclohexylphosphino-2',4',6'-triisopropylbiphenyl were added thereto, followed by stirring at room temperature for 6 hours. After confirming the completion of reaction by TLC, water was added, and the reaction mixture was further stirred for 1 hour. The crude crystal produced was separated by filtration, dissolved in chloroform and dried over anhydrous magnesium sulfate. The inorganic salt was separated by filtration and the filtrate was then concentrated by a rotary evaporator. The obtained crystal was washed by dispersion with hexane to obtain 5.06 g (yield: 66.1%) of Compound (1).

$^1$H-NMR (400 MHz, in CDCl$_3$):

δ (ppm)=7.40-7.53 (m, 8H), 7.56-7.61 (m, 4H), 7.67 (dd, J=7.6, 7.8 Hz, 1H).

<Synthesis of Compound (2)>

In a 300 mL-volume three-necked flask, 3.44 g (20.0 mmol) of Compound (A), 8.32 g (42.0 mmol) of 2-biphenylboric acid, 10.5 g (120 mmol) of potassium fluoride and 34 ml of THF were added and while stirring the mixture at room temperature, 0.09 g (0.40 mmol) of palladium acetate and 0.29 g (0.61 mmol) of 2-dicyclohexylphosphino-2',4',6'-triisopropylbiphenyl were added thereto, followed by stirring at room temperature for 6 hours. After confirming the completion of reaction by TLC, water was added, and the reaction mixture was further stirred for 1 hour. The crude crystal produced was separated by filtration, dissolved in chloroform and dried over anhydrous magnesium sulfate. The inorganic salt was separated by filtration and the filtrate was then concentrated by a rotary evaporator. The obtained crystal was washed by dispersion with hexane to obtain 7.20 g (yield: 88.3%) of Compound (2).

$^1$H-NMR (300 MHz, in dmso-d$_6$): δ (ppm)=6.9-7.6 (m, 21H).

<Synthesis of Compound (19)>

In a 200 mL-volume three-necked flask, 1.72 g (10.0 mmol) of Compound (A), 3.50 g (21.0 mmol) of nitrophenylboric acid, 3.5 g (60 mmol) of potassium fluoride and 52 ml of THF were added and while stirring the mixture at room temperature, 0.067 g (0.30 mmol) of palladium acetate and 0.14 g (0.29 mmol) of 2-dicyclohexylphosphino-2',4',6'-triisopropylbiphenyl were added thereto, followed by stirring at room temperature for 1 hour and under reflux with heating for 3 hours. After confirming the completion of reaction by TLC, water was added, and the reaction mixture was further stirred for 1 hour. The crude crystal produced was separated by filtration. The obtained crystal was washed by a mixed dispersion of hexane and ethyl acetate (1:1) to obtain 3.00 g (yield: 87.0%) of Compound (19).

¹H-NMR (400 MHz, in CDCl₃):

δ (ppm)=7.62 (d, 2H, J=7.8 Hz), 7.73 (t, 2H, J=8.0 Hz), 7.95-8.00 (m, 2H), 8.35-8.40 (m, 2H), 8.48-8.55 (m, 2H).

<Synthesis of Compound (91)>

In a 200 mL-volume three-necked flask, 1.97 g (11.5 mmol) of Compound (A), 5.0 g (25 mmol) of 3-biphenylboric acid, 4.0 g (69 mmol) of potassium fluoride and 50 ml of THF were added and while stirring the mixture at room temperature, 0.051 g (0.23 mmol) of palladium acetate and 0.16 g (0.33 mmol) of 2-dicyclohexylphosphino-2',4',6'-triisopropylbiphenyl were added thereto, followed by stirring at room temperature for 6 hours. After confirming the completion of reaction by TLC, water was added, and the reaction mixture was further stirred for 1 hour. The crude crystal produced was separated by filtration, dissolved in chloroform and dried over anhydrous magnesium sulfate. The inorganic salt was separated by filtration and the filtrate was then concentrated by a rotary evaporator. The resulting residue was purified by silica gel column chromatography and washed by dispersion with hexane to obtain 4.37 g (yield: 93.5%) of Compound (91).

¹H-NMR (300 MHz, in CDCl₃): δ (ppm)=7.33 (m, 2H), 7.43-7.50 (m, 4H), 7.54-7.62 (m, 6H), 7.64-7.74 (m, 7H), 7.82-7.85 (m, 2H)

<Synthesis of Compound (101)>

In a 200 mL-volume three-necked flask, 1.51 g (8.79 mmol) of Compound (A), 5.0 g (19 mmol) of trifluoromethylphenylboric acid, 3.1 g (53 mmol) of potassium fluoride and 50 ml of THF were added and while stirring the mixture at room temperature, 0.040 g (0.18 mmol) of palladium acetate and 0.13 g (0.27 mmol) of 2-dicyclohexylphosphino-2',4',6'-triisopropylbiphenyl were added thereto, followed by stirring at room temperature for 1 hours and under reflux with heating for 3 hours. After confirming the completion of reaction by TLC, water was added, and the reaction mixture was further stirred for 1 hour. The crude crystal produced was separated by filtration, dissolved in chloroform and dried over anhydrous magnesium sulfate.

¹H-NMR (300 MHz, in CDCl₃): δ (ppm)=7.63 (d, 2H, J=7.8 Hz), 7.63 (d, 2H, J=7.8 Hz), 7.85 (dd, 1H, J=6.9, 8.4 Hz), 8.02 (br. s, 2H), 8.05 (br. s, 4H).

<Synthesis of Compound (B)>

In a 300 mL-volume three-necked flask, 7.2 g (129 mmol) of reduced iron, 0.72 g (13.5 mmol) of ammonium chloride, 100 ml of 2-propanol and 10 ml of water were added and while stirring the mixture with heating under reflux, 0.7 ml of acetic acid was further added and stirred for 10 minutes. Further, 7.2 g (20.9 mmol) of Compound (19) was added little by little thereto under reflux with heating. After stirring the resulting mixture for 1 hour under reflux with heating, Celite-filtration was effected. The resulting product was washed with hot 2-propanol, then the filtrate was concentrated. The residue obtained was washed by dispersion with hexane and ethyl acetate to obtain 1.73 g (yield: 29.0%) of Compound (B).

¹H-NMR (300 MHz, in CDCl₃): δ (ppm)=3.78 (br. s, 4H, —NH₂), 6.76 (dd, 2H, 0.9, 8.0 Hz), 6.88 (br. t, 2H, J=1.9 Hz), 6.92-6.96 (m, 2H), 7.25-7.29 (m, 2H), 7.43 (br. d, 2H, J=7.6 Hz), 7.61 (dd, 2H, J=7.2 Hz, 8.2 Hz).

<Synthesis of Compound (102)>

In a 300 mL-volume three-necked flask, 2.38 g (8.34 mmol) of Compound (B), 5.20 g (16.7 mmol) of 2,2'-dibromobiphenyl, 4.80 g (49.9 mmol) of sodium tert-butoxide and 100 ml of toluene were added and while stirring the mixture at room temperature, 0.29 g (0.50 mmol) of bis(dibenzylideneacetone)palladium dibenzylidene and 0.48 g (1.01 mmol) of 2-dicyclohexylphosphino-2',4',6'-triisopropylbiphenyl were added thereto, followed by stirring under reflux with heating for 3 hours. After confirming the completion of reaction by TLC, water and ethyl acetate were added, and the reaction mixture was further stirred for 1 hour. The resulting reaction mixture was subjected to Celite-filtration and the filtrate was extracted with ethyl acetate. The collected organic layer was dried over anhydrous magnesium sulfate. The inorganic salt was separated by filtration and the filtrate was then concentrated by a rotary evaporator. The resulting residue was washed by dispersion with ethyl acetate to obtain 1.73 g (yield: 35.0%) of Compound (102).

¹H-NMR (300 MHz, in CDCl₃):

δ (ppm)=7.26-7.34 (m, 4H), 7.40-7.45 (m, 4H), 7.55-7.62 (m, 6H), 7.66-7.85 (m, 9H), 8.15 (br. d, 4H, J=7.7 Hz).

<Synthesis of Compound (107)>

Compound (107) was synthesized from stating compound (c) according to the same manner as that of synthesizing Compound (19) or Compound (102).

¹H-NMR (300 MHz, in CDCl₃):

δ (ppm)=7.26-7.37 (m, 4H), 7.40-7.47 (m, 4H), 7.57 (br. d, 4H, J=8.2 Hz), 7.65-7.74 (m, 2H), 7.75-7.85 (m, 8H), 8.15 (br. d, 4H, J=7.8 Hz).

<Synthesis of Compound (F)>

A 10.0 g (28.7 mmol) amount of Compound (E) which can be synthesized by the method described in, for example, European Journal of Organic Chemistry 2004, (3), 643-646 was dissolved in 100 ml of carbon tetrachloride. Then, 0.69 g (1.01 mmol) of benzoyl peroxide and 17.9 g (100 mmol) of N-bromosuccinimide were added thereto. The resulting mixture was refluxed under heating for 12 hours. Acetonitrile was added thereto to obtain the crystal of Compound (F) and the crystal was separated by filtration. Compound (F) obtained was used to the following reaction without further purification.

<Synthesis of Compound (I)>

To 12.0 g (20.5 mmol) of crude crystal of Compound (F) were added 10.1 g (123 mmol) of sodium acetate and 50 ml of acetic acid. The resulting mixture was stirred under reflux with heating for 6 hours. Water was added thereto. Successively, the resulting crude crystal of Compound (G) was separated by filtration and placed into a 300 mL-volume three-necked flask. Then 50 ml of ethanol and 3.44 g (82.0 mmol) of lithium hydroxide monohydrate were added thereto. The resulting mixture was stirred under reflux with heating for 4 hours. Water was added thereto. The resulting crude crystal was washed by dispersion with acetonitrile. To 3.60 g (9.08 mmol) of Compound (H) produced, were added 250 ml of dichloromethane and 7.0 g (32 mmol) of pyridinium chlorochromate. The resulting mixture was stirred at room temperature for 12 hours. Then chrome residue was removed off by Celite-filtration and the filtrate was washed with dilute hydrochloric acid. The collected organic layer was dried over anhydrous magnesium sulfate. The inorganic salt was separated by filtration and the filtrate was then concentrated by a rotary evaporator. The resulting residue was washed by dispersion with ethyl acetate to obtain 2.65 g (yield: 35.0%) of Compound (I).

¹H-NMR (300 MHz, in CDCl₃):

δ (ppm)=7.27-7.38 (m, 6H), 7.40-7.55 (m, 9H), 9.71 (s, 3H, —CHO).

<Synthesis of Compound (111)>

In a 200 mL-volume three-necked flask, 1.41 g (3.61 mmol) of Compound (I), 1.0 g (14.4 mmol) of hydroxylamine hydrochloride, 2.3 ml (28 mmol) of pyridine and 54 ml of toluene were added and stirred the resulting mixture under reflux with heating for 3 hours. After confirming the completion of reaction by TLC, the mixture obtained was cooled to room temperature, then, water, dilute hydrochloric acid and ethyl acetate were added thereto. The reaction mixture was extracted with ethyl acetate. The collected organic layer was dried over anhydrous magnesium sulfate. The inorganic salt was separated by filtration and the filtrate was then concentrated by a rotary evaporator. The resulting residue was placed into a 500 mL-volume three-necked flask and 100 ml of dichloromethane was added thereto. Successively, at room temperature, 3.41 g (13.0 mmol) of triphenyl phosphine was added and 1.73 g (13.0 mmol) of N-chlorosuccinimide was added little by little thereto, followed by stirring at room temperature for 2 hours. After confirming the completion of reaction by TLC, water and ethyl acetate were added thereto. The reaction mixture was extracted with ethyl acetate. The collected organic layer was dried over anhydrous magnesium sulfate. The inorganic salt was separated by filtration and the filtrate was then concentrated by a rotary evaporator. The resulting residue was purified by silica gel column chromatography to obtain 1.20 g (yield: 87%) of Compound (111).

$^1$H-NMR (300 MHz, in CDCl$_3$): δ (ppm)=7.62 (br. s, 15H). $^{13}$C-NMR (75 MHz, in CDCl$_3$)): δ (ppm)=114.5, 115.0, 129.0, 129.2, 131.0, 134.0, 154.6. (300 MHz, in DMSO-d$_6$): δ (ppm)=7.62-7.67 (m, 9H), 7.70-7.77 (m, 6H).

At the synthesis of the compound of the present invention, the reaction time varies depending on the activity of reaction and is not particularly limited but is preferably from 1 minute to 5 days, more preferably from 5 minutes to 3 days, still more preferably from 10 minutes to 24 hours.

At the synthesis of the compound of the present invention, the reaction temperature varies depending on the activity of reaction and is not particularly limited but is preferably from 0 to 300° C., more preferably from 5 to 250° C., still more preferably from 10 to 200° C.

The light-emitting device containing the compound of the present invention is described below. The light-emitting device of the present invention is characterized by using the compound of the present invention, and normal light-emitting system, driving method, utilization mode and the like may be used. The compound of the present invention is preferably used as a light-emitting material, a host material, an exciton blocking material, a charge blocking material or a charge transport material, more preferably as a host material, an exciton blocking material or a charge transport material. In the case of use as a light-emitting material, the light emission may be either ultraviolet emission or infrared emission and may be either fluorescent emission or phosphorescent emission. In the case of use as a charge transport material, the transport property may either hole transport property or electron transport property. Also, the compound of the present invention is preferably used in combination with a metal complex described in International Publication Nos. 04/099339 (pamphlet), 04/006498 (pamphlet) and 04/108857 (pamphlet).

In the case where the compound of the present invention is used as a light-emitting material in the light-emitting layer, the compound is preferably contained in the light-emitting layer in an amount of 0.1 to 40 mass %, more preferably from 0.5 to 20 mass %. (In this specification, mass ratio is equal to weight ratio.)

In the case where the compound is used as a host material in the light-emitting layer, the compound is preferably contained in the light-emitting layer in an amount of 60 to 99.9 mass %, more preferably from 80 to 99.5 mass %.

In the case where the compound is contained in a layer other than the light-emitting layer, the compound is preferably contained in the layer in an amount of 0.5 to 100 mass %, more preferably from 10 to 100 mass %.

In particular, when the compound of the present invention having a structure that an aromatic ring or heterocyclic ring is substituted at the ortho-position of a cyano group is used as a host material in the light-emitting layer in combination with a phosphorescent material, an organic electroluminescent device reduced in the driving voltage and assured of high durability is obtained and this is preferred.

[Organic Electroluminescent Device]

The organic electroluminescent device of the present invention is described in detail below.

The light-emitting device of the present invention has a cathode and an anode on a substrate and between these two electrodes, has an organic compound layer including an organic light-emitting layer (hereinafter sometimes simply referred to as a "light-emitting layer"). Considering the property of the light-emitting device, at least one electrode out of the anode and the cathode is preferably transparent.

The elements constituting the light-emitting device of the present invention are described in detail below.

<Substrate>

The substrate for use in the present invention is preferably a substrate which does not scatter or attenuate the light emitted from the organic compound layer. Specific examples thereof include an inorganic material such as zirconia stabilized with yttrium (YSZ) and glass, and an organic material such as polyester (e.g., polyethylene terephthalate, polybutylene phthalate, polyethylene naphthalate), polystyrene, polycarbonate, polyethersulfone, polyallylate, polyimide, polycycloolefin, norbornene resin and poly(chlorotrifluoroethylene).

For example, in the case of using glass as the substrate, the construction material used therefor is preferably non-alkali glass so as to reduce the ion dissolved out from the glass. Also, in the case of using soda lime glass, a barrier coat such as silica is preferably applied thereto before use. In the case of an organic material, those excellent in the heat resistance, dimensional stability, solvent resistance, electrical insulation and processability are preferred.

The shape, structure, size and the like of the substrate are not particularly limited and may be appropriately selected, for example, according to the usage or purpose of the light-emitting device. In general, the substrate shape is preferably a plate form. The substrate structure may be a single-layer structure or a multilayer structure and may be formed of a single member or two or more members.

The substrate may be colorless and transparent or may be colored and transparent but from the standpoint that the light emitted from the organic light-emitting layer is free from scattering, attenuation or the like, the substrate is preferably colorless and transparent.

A moisture permeation-preventing layer (gas barrier layer) may be provided on the front surface or back surface of the substrate.

As for the material of the moisture permeation-preventing layer (gas barrier layer), an inorganic substance such as silicon nitride and silicon oxide is suitably used. The moisture permeation-preventing layer (gas barrier layer) can be formed by, for example, a high-frequency sputtering method.

In the case of using a thermoplastic substrate, a hardcoat layer, an undercoat layer and the like may be further provided, if desired.

<Anode>

The anode is usually sufficient if it has a function as an electrode of supplying a hole to the organic compound layer. The shape, structure, size and the like thereof are not particularly limited, and the anode material may be appropriately selected from known electrode materials according to the usage or purpose of the light-emitting device. The anode is usually provided as a transparent anode.

Suitable examples of the material for the anode include a metal, an alloy, a metal oxide, an electrically conducting compound and a mixture thereof. Specific examples of the anode material include an electrically conducting metal oxide such as tin oxide doped with antimony, fluorine or the like (ATO, FTO), tin oxide, zinc oxide, indium oxide, indium tin oxide (ITO) and indium zinc oxide (IZO); a metal such as gold, silver, chromium and nickel; a mixture or laminate of the metal and the electrically conducting metal oxide; an inorganic electrically conducting substance such as copper iodide and copper sulfide; an organic electrically conducting material such as polyaniline, polythiophene and polypyrrole; and a laminate of such a material and ITO. Among these, an electrically conducting metal oxide is preferred, and ITO is more preferred in view of productivity, high electrical conductivity, transparency and the like.

The anode can be formed on the substrate by a method appropriately selected taking into consideration the suitability for the material constituting the anode, from a wet system such as printing and coating, a physical system such as vacuum deposition, sputtering and ion plating, and a chemical system such as CVD and plasma CVD. For example, in the case of selecting ITO as the anode material, the anode may be formed by a DC or high-frequency sputtering method, a vacuum deposition method or an ion plating method.

In the organic electroluminescent device of the present invention, the position where the anode is formed is not particularly limited and may be appropriately selected according to the usage or purpose of the light-emitting device, but the anode is preferably formed on the substrate. In this case, the anode may be formed entirely or partially on one surface of the substrate.

The patterning when forming the anode may be performed by chemical etching such as photolithography, by physical etching using a laser or the like, by vacuum deposition or sputtering using a mask, or by a lift-off method or printing method.

The thickness of the anode may be appropriately selected according to the material constituting the anode is usually on the order of 10 nm to 50 µm, preferably from 50 nm to 20 µm.

The resistance value of the anode is preferably $10^3$ Ω/square or less, more preferably $10^2$ Ω/square or less. In the case where the anode is transparent, the anode may be colorless and transparent or may be colored and transparent. In order to take out light from the transparent anode side, the transmittance of the anode is preferably 60% or more, more preferably 70% or more.

Incidentally, the transparent anode is described in detail in Yutaka Sawada (supervisor), Tomei Denkyoku Maku no Shin-Tenkai (New Development of Transparent Electrode Film, CMC (1999), and the matters described therein can be applied in the present invention. In the case of employing a plastic substrate having low heat resistance, a transparent anode film-formed using ITO or IZO at a low temperature of 150° C. or less is preferred.

<Cathode>

The cathode is usually sufficient if it has a function as an electrode of injecting an electron in the organic compound layer. The shape, structure, size and the like thereof are not particularly limited, and the cathode material may be appropriately selected from known electrode materials according to the usage or purpose of the light-emitting device.

Examples of the material constituting the cathode include a metal, an alloy, a metal oxide, an electrically conducting compound and a mixture thereof. Specific examples thereof include an alkaline metal (e.g., Li, Na, K, Cs), an alkaline earth metal (e.g., Mg, Ca), gold, silver, lead, aluminum, a sodium-potassium alloy, a lithium-aluminum alloy, a magnesium-silver alloy, and a rare earth metal such as indium and ytterbium. One species of these materials may be used alone, but in view of satisfying both stability and electron-injecting property, two or more species may be suitably used in combination.

Among these materials constituting the cathode, an alkaline metal and an alkaline earth metal are preferred in view of electron-injecting property, and a material mainly comprising aluminum is preferred in view of excellent storage stability.

The "material mainly comprising aluminum" indicates aluminum alone or an alloy or mixture of aluminum with 0.01 to 10 mass % of an alkaline metal or alkaline earth metal (for example, a lithium-aluminum alloy and a magnesium-aluminum alloy).

Incidentally, the cathode material is described in detail in JP-A-2-15595 and JP-A-5-121172, and the materials described therein can be applied also in the present invention.

The method for forming the cathode is not particularly limited, and the cathode may be formed according to known methods. For example, the cathode may be formed by a method appropriately selected taking into consideration the suitability for the material constituting the cathode, from a wet system such as printing and coating, a physical system such as vacuum deposition, sputtering and ion plating, and a chemical system such as CVD and plasma CVD. For example, in the case of selecting a metal or the like as the cathode material, one species or two or more species thereof may be sputtered simultaneously or sequentially.

The patterning when forming the cathode may be performed by chemical etching such as photolithography, by physical etching using a laser or the like, by vacuum deposition or sputtering using a mask, or by a lift-off method or printing method.

In the present invention, the position where the cathode is formed is not particularly limited, and the cathode may be formed entirely or partially on the organic compound layer.

A dielectric layer comprising a fluoride, oxide or the like of an alkaline metal or alkaline earth metal may be inserted between the cathode and the organic compound layer to have a thickness of 0.1 to 5 nm. This dielectric layer may be regarded as a kind of electron injection layer. The dielectric layer can be formed, for example, by a vacuum vapor deposition method, a sputtering method or an ion plating method.

The thickness of the cathode may be appropriately selected according to the material constituting the cathode and cannot be indiscriminately specified but is usually on the order of 10 nm to 5 µm, preferably from 50 nm to 1 µm.

The cathode may be transparent or opaque. The transparent cathode may be formed by film-forming the cathode material to a small thickness of 1 to 10 nm and further stacking thereon a transparent electrically conducting material such as ITO and IZO.

<Organic Compound Layer>

The organic compound layer for use in the present invention is described below.

The organic electroluminescent device of the present invention has at least one organic compound layer including a light-emitting layer, and the organic compound layer other than the light-emitting layer includes, as described above, layers such as hole transport layer, electron transport layer, charge blocking layer, hole injection layer and electron injection layer.

As for the embodiment of stacking in the organic compound layer of the present invention, an embodiment where a hole transport layer, a light-emitting layer and an electron transport layer are stacked in this order from the anode side is preferred. Furthermore, a charge blocking layer or the like may be provided between the hole transport layer and the light-emitting layer or between the light-emitting layer and the electron transport layer. Also, a hole injection layer may be present between the anode and the hole transport layer, and an electron injection layer may be present between the cathode and the electron transport layer. Incidentally, each layer may be composed of a plurality of secondary layers.

—Formation of Organic Compound Layer—

In the organic electroluminescent device of the present invention, the layers constituting the organic compound layer each may be suitably formed by any method such as dry film-forming method (e.g., vapor deposition, sputtering), transfer method and printing method.

—Organic Light-Emitting Layer—

The organic light-emitting layer is a layer having a function of, when an electric field is applied, receiving a hole from the anode, hole injection layer or hole transport layer, receiving an electron from the cathode, electron injection layer or electron transport layer, and providing a site for recombination of a hole and an electron, thereby emitting light.

In the present invention, the light-emitting layer may be composed of only a light-emitting material or may have a mixed layer structure of a host material and a light-emitting material. The light-emitting material may be either a fluorescent material or a phosphorescent material (triplet light-emitting material) and as for the dopant, one species or two or more species may be used. The host material is preferably a charge transport material. As for the host material, one species or two or more species may be used, and examples thereof include a construction where an electron-transporting host material and a hole-transporting host material are mixed. Also, the light-emitting layer may contain a material which does not have electron transport property and does not emit light.

Furthermore, the light-emitting layer may be composed of one layer or two or more layers, and the layers may differ in the color of light emitted.

Examples of the fluorescent material which can be used include a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a condensed aromatic compound, a perynone derivative, an oxadiazole derivative, an oxazine derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidine compound, various metal complexes as represented by a metal complex of 8-quinolinol derivative and a metal complex of pyrromethene derivative, a polymer compound such as polythiophene, polyphenylene and polyphenylenevinylene, and a compound such as organic silane derivative.

Examples of the ligand of the complex include the ligands described in G. Wilkinson et al., Comprehensive Coordination Chemistry, Pergamon Press (1987), H. Yersin, Photochemistry and Photophysics of Coordination Compounds, Springer-Verlag (1987), and Akio Yamamoto, Yuki Kinzoku Kagaku—Kiso to Oyo— (Metalorganic Chemistry—Foundation and Application—), Shokabo (1982).

Specifically, the ligand is preferably a halogen ligand (preferably chlorine ligand), a nitrogen-containing heterocyclic ligand (e.g., phenylpyridine, benzoquinoline, quinolinol, bipyridyl, phenanthroline), a diketone ligand (e.g., acetylacetone), a carboxylic acid ligand (e.g., acetic acid ligand), a carbon monoxide ligand, an isonitrile ligand or a cyano ligand, more preferably a nitrogen-containing heterocyclic ligand. The complex may have one transition metal atom in the compound or may be a so-called dinuclear complex having two or more transition metal atoms. Different kinds of metal atoms may be contained at the same time.

The device of the present invention preferably contains at least one phosphorescent material in the light-emitting layer. The phosphorescent material is preferably an iridium complex or a platinum complex, more preferably a platinum complex. Specific examples thereof include platinum complexes described in International Publication Nos. 04/099339 (pamphlet), 04/006498 (pamphlet) and 04/108857 (pamphlet), and a platinum complex selected therefrom is preferably used in combination.

The phosphorescent material is preferably contained in the light-emitting layer in an amount of 0.1 to 40 mass %, more preferably from 0.5 to 20 mass %.

Examples of the host material contained in the light-emitting layer of the present invention include the materials having a carbazole skeleton, a diarylamine skeleton, a pyridine skeleton, a pyrazine skeleton, a triazine skeleton or an arylsilane skeleton, and the materials described later in the paragraphs of hole injection layer, hole transport layer, electron injection layer and electron transport layer.

The thickness of the light-emitting layer is not particularly limited but usually, the thickness is preferably from 1 to 500 nm, more preferably from 5 to 200 nm, still more preferably from 10 to 100 nm.

—Hole Injection Layer, Hole Transport Layer—

The hole injection layer and hole transport layer are a layer having a function of receiving a hole from the anode or anode side and transporting it to the cathode side. Specifically, the hole injection layer and hole transport layer each is preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, an organic silane compound, carbon or the like.

The thickness of each of the hole injection layer and the hole transport layer is preferably 500 nm or less from the standpoint of lowering the driving voltage.

The thickness of the hole transport layer is preferably from 1 to 500 nm, more preferably from 5 to 200 nm, still more preferably from 10 to 100 nm, and the thickness of the hole injection layer is preferably from 0.1 to 200 nm, more preferably from 0.5 to 100 nm, still more preferably from 1 to 100 nm.

The hole injection layer and hole transport layer each may have a single-layer structure comprising one species or two or more species of the above-described materials or may have a multilayer structure comprising a plurality of layers having the same composition or different compositions.

—Electron Injection Layer, Electron Transport Layer—

The electron injection layer and electron transport layer are a layer having a function of receiving an electron from the cathode or cathode side and transporting it to the anode side. Specifically, the electron injection layer and electron transport layer each is preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, an aromatic ring tetracarboxylic acid anhydride such as naphthalene and perylene, a phthalocyanine derivative, various metal complexes as represented by a metal complex of 8-quinolinol derivative and a metal complex having metal phthalocyanine, benzoxazole or benzothiazole as a ligand, an organic silane derivative or the like.

The thickness of each of the electron injection layer and the electron transport layer is preferably 500 nm or less from the standpoint of lowering the driving voltage.

The thickness of the electron transport layer is preferably from 1 to 500 nm, more preferably from 5 to 200 nm, still more preferably from 10 to 100 nm, and the thickness of the electron injection layer is preferably from 0.1 to 200 nm, more preferably from 0.2 to 100 nm, still more preferably from 0.5 to 50 nm.

The electron injection layer and electron transport layer each may have a single-layer structure comprising one species or two or more species of the above-described materials or may have a multilayer structure comprising a plurality of layers having the same composition or different compositions.

—Hole Blocking Layer—

The hole blocking layer is a layer having a function of preventing the hole transported from the anode side to the light-emitting layer, from penetrating to the cathode side. In the present invention, the hole blocking layer may be provided as an organic compound layer adjacent to the light-emitting layer on the cathode side.

Examples of the organic compound constituting the hole blocking layer include an aluminum complex such as BAlq, a triazole derivative, and a phenanthroline derivative such as BCP.

The thickness of the hole blocking layer is preferably from 1 to 500 nm, more preferably from 5 to 200 nm, still more preferably from 10 to 100 nm.

The hole blocking layer may have a single-layer structure comprising one species or two or more species of the above-described materials or may have a multilayer structure comprising a plurality of layers having the same composition or different compositions.

The layer containing the compound of the present invention may be adjacent to a layer comprising an oxide containing at least one of an alkaline metal and an alkaline earth metal. As oxides including an alkaline metal, mention may be made of lithium oxide, sodium oxide, potassium oxide, rubidium oxide and cesium oxide. As oxides including an alkaline earth metal, mention may be made of beryllium oxide, magnesium oxide, calcium oxide, strontium oxide and barium oxide.

The layer containing the compound of the present invention may be adjacent to a layer containing at least one of an alkaline metal and an alkaline earth metal. Examples of the alkaline metal and the alkaline earth metal include lithium, sodium, potassium, rubidium, cesium, beryllium, magnesium, calcium, strontium and barium.

The layer containing the compound of the present invention may be adjacent to a layer comprising a halide containing at least one of an alkaline metal and an alkaline earth metal. As halides including an alkaline metal, mention may be made of fluorides, chlorides, bromides and iodides of lithium, sodium, potassium, rubidium and cesium. As halides including an alkaline earth metal, mention may be made of fluorides, chlorides, bromides and iodides of beryllium, magnesium, calcium, strontium and barium.

<Protective Layer>

In the present invention, the entire organic EL device may be protected by a protective layer.

The material contained in the protective layer may be sufficient if it has a function of preventing a device deterioration promoter such as moisture and oxygen from intruding into the device.

Specific examples thereof include a metal such as In, Sn, Pb, Au, Cu, Ag, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a metal nitride such as $SiN_x$ and $SiN_xO_y$, a metal fluoride such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water-absorbing substance having a water absorption percentage of 1% or more, and a moisture-proof substance having a water absorption percentage of 0.1% or less.

The method for forming the protective layer is not particularly limited, and examples of the method which can be applied include a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a coating method, a printing method and a transfer method.

<Encapsulation>

The organic electroluminescent device of the present invention may be subjected to encapsulation of the entire device by using a sealing container.

Also, a moisture absorbent or an inactive liquid may be enclosed in the space between the sealing container and the light-emitting device. The moisture absorbent is not particularly limited but examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inactive liquid is not particularly limited but examples thereof include paraffins, liquid paraffins, a fluorine-based solvent such as perfluoroalkane, perfluoroamine and perfluoroether, a chlorine-based solvent and silicone oils.

In the organic electroluminescent device of the present invention, a DC (if desired, may contain an AC component) voltage (usually from 2 to 15 V) or a DC current is passed between the anode and the cathode, whereby light emission can be obtained.

As for the driving method of the organic electroluminescent device of the present invention, the driving methods described, for example, in JP-A-2-148687, JP-A-6-301355, JP-A-5-29080, JP-A-7-134558, JP-A-8-234685, JP-A-8-241047, Japanese Patent 2,784,615, and U.S. Pat. Nos. 5,828,429 and 6,023,308 may be applied.

EXAMPLES

The present invention is described in detail below by referring to Examples, but the present invention is not limited thereto.

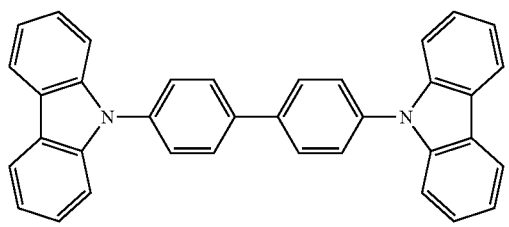

CBP

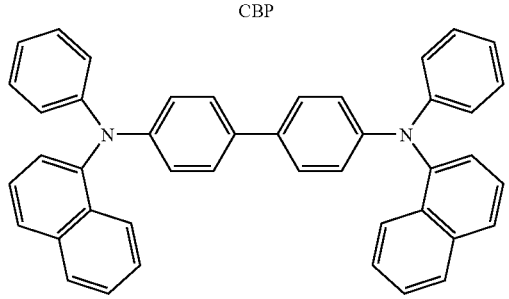

NPD

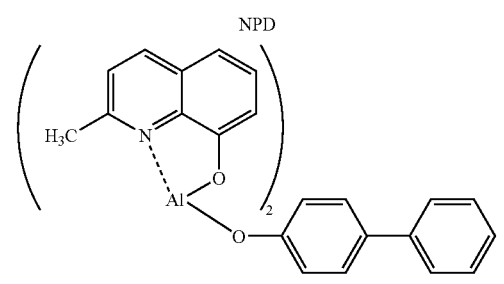

BAlq

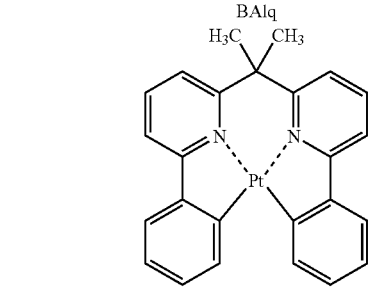

Compound (79)

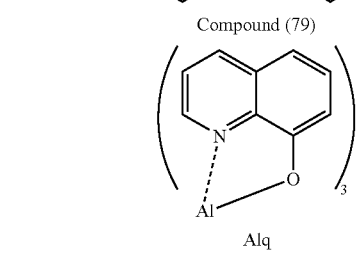

Alq

Comparative Example 1

A cleaned substrate having an ITO electrodeposition layer was placed in a vapor deposition apparatus and NPD was vapor-deposited to 50 nm. Thereafter, CBP and Compound (79) (a compound described in International Publication No. 2004/108857) were vapor-deposited thereon to 40 nm at a mass ratio of 10:1, BAlq was then vapor-deposited thereon to 3 nm, and Alq was further vapor-deposited thereon to 30 nm. A patterned mask (giving a light emission area of 4 mm×5 mm) was put on the obtained organic thin film and after vapor-depositing lithium fluoride to 3 nm, aluminum was vapor-deposited to 60 nm to produce an organic EL device of Comparative Example 1. A DC constant current at a current density of 500 A/m$^2$ was passed to the obtained organic EL device, as a result, light emission was observed. The light was emitted with a brightness of 300 cd/m$^2$ for 10 hours.

Example 1

An organic EL device of Example 1 was produced in the same manner as in Comparative Example 1 except that Compound (2) of the present invention is used in place of BAlq in Comparative Example 1. A DC constant current at a current density of 500 A/m$^2$ was passed to the obtained organic EL device, as a result, light emission was observed. When the light was emitted with a brightness of 300 cd/m$^2$ for 10 hours, the driving voltage was low and the increase of voltage was small as compared with Comparative Example 1.

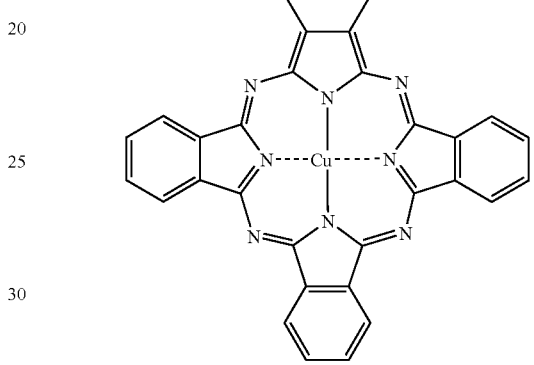

CuPc

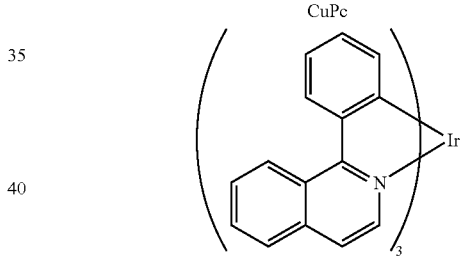

Ir(plq)$_3$

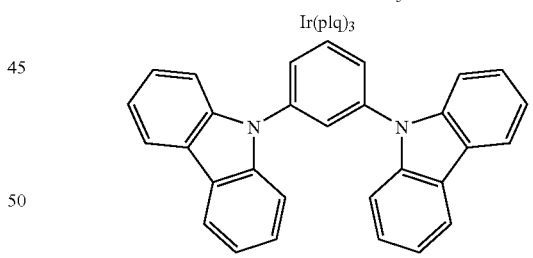

MCP

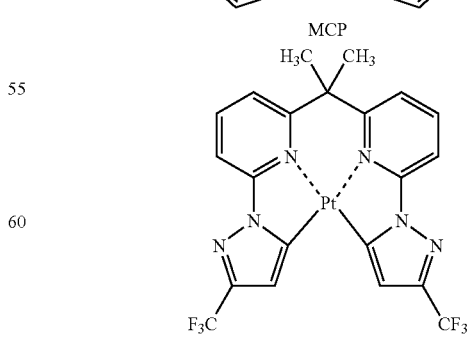

Compound 2 described in
WO2006/098505

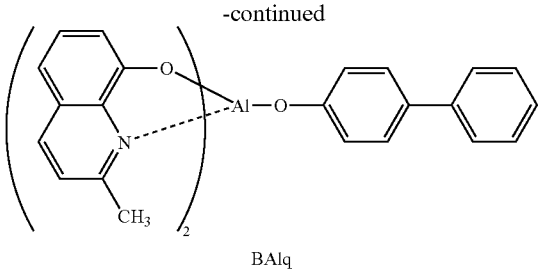

BAlq

Comparative Example 2

A cleaned substrate having an ITO electrodeposition layer was placed in a vapor deposition apparatus and NPD was vapor-deposited to 50 nm. Thereafter, Balq and Ir(piq)$_3$ were vapor-deposited thereon to 29 nm at a mass ratio of 20:1, and Alq was further vapor-deposited thereon to 50 nm. A patterned mask (giving a light emission area of 4 mm×5 mm) was put on the obtained organic thin film and after vapor-depositing lithium fluoride to 1 nm, aluminum was vapor-deposited to 60 nm to produce an organic EL device of Comparative Example 2. A DC constant current at a current density of 500 A/m$^2$ was passed to the obtained organic EL device, as a result, red light emission was observed. The produced organic electroluminescent device was set on the emission spectrum determination system (ELS1500) manufactured by Shimadzu corporation and the emission efficiency (external quantum efficiency) at a brightness of 100 cd/m$^2$ was determined. As a result, it was 9.7% and the driving voltage was 10 V.

Example 2

An organic EL device of Example 2 was produced in the same manner as in Comparative Example 2 except that Compound (2) of the present invention was used in place of BAlq in Comparative Example 2. A DC constant current at a current density of 500 A/m$^2$ was passed to the obtained organic EL device, as a result, red light emission was observed. The produced organic EL device was set on the emission spectrum determination system (ELS1500) manufactured by Shimadzu corporation and the emission efficiency (external quantum efficiency) at a brightness of 100 cd/m$^2$ was determined. As a result, it was 10.2% and the driving voltage was 9.5 V.

Comparative Example 3

A cleaned substrate having an ITO electrodeposition layer was placed in a vapor deposition apparatus and CuPc was vapor-deposited to 10 nm and NPD was vapor-deposited to 50 nm. Thereafter, MCP and Compound (2) described in International Publication No. 2006/098505, pamphlet were vapor-deposited thereon to 29 nm at a mass ratio of 20:1, and BAlq was further vapor-deposited thereon to 50 nm. A patterned mask (giving a light emission area of 4 mm×5 mm) was put on the obtained organic thin film and after vapor-depositing lithium fluoride to 1 nm, aluminum was vapor-deposited to 60 nm to produce an organic EL device of Comparative Example 3. A DC constant current at a current density of 360 A/m was passed to the obtained organic EL device, as a result, blue light emission was observed. The produced organic electroluminescent device was set on the emission spectrum determination system (ELS1500) manufactured by Shimadzu corporation and the emission efficiency (external quantum efficiency) at a brightness of 100 cd/m$^2$ was determined. As a result, it was 6.0%.

Example 3

An organic electroluminescent device of Example 3 was produced in the same manner as in Comparative Example 3 except that Compound (2) of the present invention was used in place of BAlq in Comparative Example 3. A DC constant current at a current density of 360 A/m$^2$ was passed to the obtained organic EL device, as a result, light emission was observed. The produced organic electroluminescent device was set on the emission spectrum determination system (ELS1500) manufactured by Shimadzu corporation and the emission efficiency (external quantum efficiency) at a brightness of 100 cd/m$^2$ was determined. As a result, it was 13.3%.

Results of organic electroluminescent devices using Compounds (91), (101), (107) and (111) of the present invention in place of Compound (2) of the present invention in Example 3 are set forth below. The driving voltages of the organic electroluminescent devices using the compounds of the present invention are equivalent to or less that of Comparative Example. Thus, the driving voltages of the organic electroluminescent devices using the compounds of the present invention are equivalent to or less those of Comparative Examples and, therefore, the organic electroluminescent devices using the compounds of the present invention are excellent in external quantum efficiency.

TABLE 1

| Entry | Compound | Driving voltage (V) | External quantum efficiency (%) | Note |
|---|---|---|---|---|
| 1 | Balq | 12.7 | 6.0 | Comparative example |
| 2 | (2) | 12.5 | 13.3 | Invention |
| 3 | (91) | 12.2 | 10.1 | Invention |
| 4 | (101) | 12.0 | 9.8 | Invention |
| 5 | (107) | 11.5 | 9.5 | Invention |
| 6 | (111) | 11.2 | 9.3 | Invention |

The organic electroluminescent device of the present invention can be suitably used in the fields such as display device, display, backlight, electrophotography, light source for illumination, light source for recording, light source for exposure, light source for reading, sign, signboard, interior accessory and optical communication. Furthermore, the compound of the present invention is applicable also to medical usage, a fluorescent brightening agent, a photographic material, a UV absorbing material, a laser coloring matter, a recording medium material, an inkjet pigment, a color filter dye, a color conversion filter, analytical usage and the like.

The organic electroluminescent device of the present invention is assured of low driving voltage and good durability. The light-emitting device of the present invention can be suitably used in the fields such as display device, display, backlight, electrophotography, light source for illumination, light source for recording, light source for exposure, light source for reading, sign, signboard, interior accessory and optical communication. Furthermore, the compound of the present invention is applicable also to medical usage, a fluorescent brightening agent, a photographic material, a UV absorbing material, a laser coloring matter, a recording medium material, an inkjet pigment, a color filter dye, a color conversion filter, analytical usage and the like.

The entire disclosure of each and every foreign patent application from which the benefit of foreign priority has been claimed in the present application is incorporated herein by reference, as if fully set forth.

What is claimed is:
1. An organic electroluminescent device, which comprises:
a pair of electrodes; and
an organic compound layer including a light-emitting layer between the pair of electrodes,
wherein the organic compound layer comprises a compound represented by formula (III):

Formula (III):

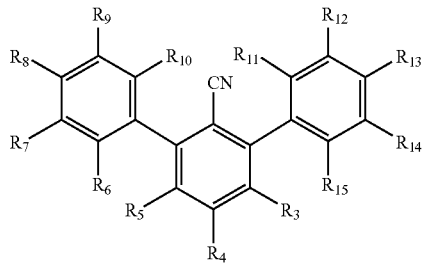

wherein $R_3$, $R_5$, $R_8$ and $R_{13}$ each represents a hydrogen atom;
$R_4$ represents a hydrogen atom, a phenyl group, a substituted phenyl group, an alkyl group, or a substituted alkyl group;
$R_6$, $R_7$, $R_9$, $R_{10}$, $R_{11}$, $R_{12}$, $R_{14}$ and $R_{15}$ each independently represents a hydrogen atom or a substituent, when $R_6$, $R_7$, $R_9$, $R_{10}$, $R_{11}$, $R_{12}$, $R_{14}$ and $R_{15}$ each represents a substituent, the substituent may further have a substituent; and
pairs of $R_6$ and $R_7$, $R_9$ and $R_{10}$, $R_{11}$ and $R_{12}$, and $R_{14}$ and $R_{15}$, each may combine to form a ring, wherein the compound represented by formula (III) has the lowest excited triplet energy level of from 65 kcal/mol (272.35 kJ/mol) to 95 kcal/mol (398.05 kJ/mol) and has a glass transition temperature of from 110 to 400° C.

2. The organic electroluminescent device according to claim 1,
wherein formula (III) is represented by formula (IV):
Formula (IV):

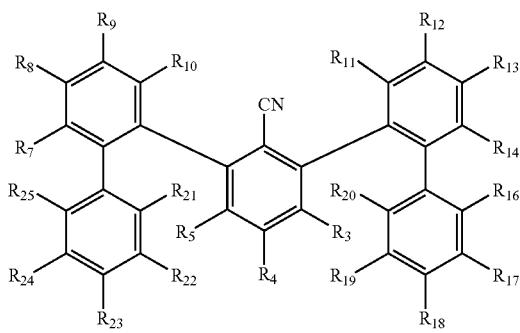

wherein $R_{16}$, $R_{17}$, $R_{18}$, $R_{19}$, $R_{20}$, $R_{21}$, $R_{22}$, $R_{23}$, $R_{24}$ and $R_{25}$ each independently represents a hydrogen atom or a substituent, when $R_{16}$, $R_{17}$, $R_{18}$, $R_{19}$, $R_{20}$, $R_{21}$, $R_{22}$, $R_{23}$, $R_{24}$ and $R_{25}$ each represents a substituent, the substituent may further have a substituent; and pairs of $R_{14}$ and $R_{16}$, $R_7$ and $R_{25}$, $R_{16}$ and $R_{17}$, $R_{17}$ and $R_{18}$, $R_{18}$ and $R_{19}$, $R_{19}$ and $R_{20}$, $R_{21}$ and $R_{22}$, $R_{22}$ and $R_{23}$, $R_{23}$ and $R_{24}$, and $R_{24}$ and $R_{25}$, each may combine to form a ring;
$R_3$, $R_4$, $R_5$, $R_7$, $R_8$, $R_9$ and $R_{10}$ have the same meanings as $R_3$, $R_4$, $R_5$, $R_7$, $R_9$, $R_9$ and $R_{10}$ in formula (III); and
$R_{11}$, $R_{12}$, $R_{13}$ and $R_{14}$ have the same meanings as $R_{11}$, $R_{12}$, $R_{13}$ and $R_{14}$ in formula (III).

3. The organic electroluminescent device according to claim 1, wherein formula (III) is represented by formula (V):
Formula (V):

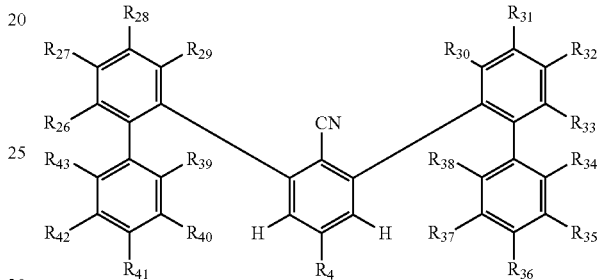

wherein $R_{26}$, $R_{28}$, $R_{29}$, $R_{30}$, $R_{31}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each independently represents a hydrogen atom or a substituent, when $R_{26}$, $R_{28}$, $R_{29}$, $R_{30}$, $R_{31}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a substituent, the substituent may further have a substituent, provided that pairs of $R_{26}$ and $R_{43}$, $R_{26}$ and $R_{39}$, $R_{28}$ and $R_{29}$, $R_{30}$ and $R_{31}$, $R_{33}$ and $R_{34}$, $R_{33}$ and $R_{38}$, $R_{34}$ and $R_{35}$, $R_{35}$ and $R_{36}$, $R_{36}$ and $R_{37}$, $R_{37}$ and $R_{38}$, $R_{39}$ and $R_{40}$, $R_{40}$ and $R_{41}$, $R_{41}$ and $R_{42}$, and $R_{42}$ and $R_{43}$, each does not combine to form a condensed ring; $R_{27}$ and $R_{32}$ each represents a hydrogen atom; and $R_4$ has the same meanings as $R_4$ in formula (III).

4. The organic electroluminescent device according to claim 1,
wherein formula (III) is represented by formula (VI):

Formula (VI):

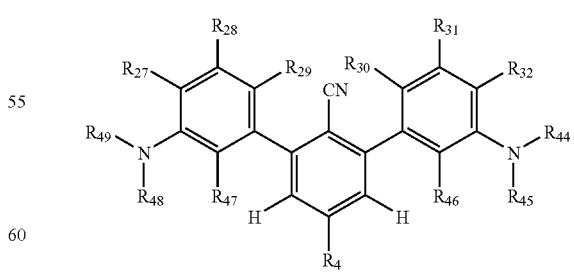

wherein $R_{44}$, $R_{45}$, $R_{48}$ and $R_{49}$ each independently represents a hydrogen atom or a substituent, when $R_{44}$, $R_{45}$, $R_{48}$ and $R_{49}$ each represents a substituent, the substituent may further have a substituent;

pairs of $R_{44}$ and $R_{45}$, and $R_{48}$ and $R_{49}$, each may combine to form a ring;

$R_{46}$ and $R_{47}$ each independently represents a hydrogen atom or a substituent, when $R_{46}$ and $R_{47}$ each represents a substituent, the substituent may further have a substituent, provided that when $R_{28}$, $R_{29}$, $R_{30}$, $R_{31}$, $R_{46}$ and $R_{47}$ each represents a substituent, pairs of $R_{44}$ and $R_{46}$, $R_{45}$ and $R_{46}$, $R_{47}$ and $R_{48}$, and $R_{47}$ and $R_{49}$, each does not combine to form a condensed ring;

$R_4$ has the same meanings as $R_4$ in formula (III);

$R_{27}$ and $R_{32}$ each represents a hydrogen atom; and $R_{28}$, $R_{29}$, $R_{30}$ and $R_{31}$ each independently represents a hydrogen atom or a substituent, when $R_{28}$, $R_{29}$, $R_{30}$ and $R_{31}$ each represents a substituent, the substituent may further have a substituent, but pairs of $R_{28}$ and $R_{29}$, and $R_{30}$ and $R_{31}$, each does not combine to form a condensed ring.

5. The organic electroluminescent device according to claim 1, wherein the light-emitting layer comprises at least one kind of a triplet-emission material.

6. The organic electroluminescent device according to claim 5, wherein the at least one kind of triplet-emission material is a platinum complex or an iridium complex.

7. The organic electroluminescent device according to claim 6, wherein the at least one kind of triplet-emission material is a platinum complex.

8. The organic electroluminescent device according to claim 1, wherein a layer comprising the compound represented by formula (III) is adjacent to a layer comprising an oxide containing at least one of an alkaline metal and an alkaline earth metal.

9. The organic electroluminescent device according to claim 1, wherein a layer comprising the compound represented by formula (III) is adjacent to a layer comprising at least one of an alkaline metal and an alkaline earth metal.

10. The organic electroluminescent device according to claim 1, wherein a layer comprising the compound represented by formula (III) is adjacent to a layer comprising a halide containing at least one of an alkaline metal and an alkaline earth metal.

11. The organic electroluminescent device according to claim 1, wherein the substituent and the further substituent are independently selected from the group consisting of a hydrogen atom, an alkyl group, an aryl group, a halogen atom, a cyano group, a heterocyclic group, and a nitro group.

12. The organic electroluminescent device according to claim 1, wherein each of $R_3$, $R_4$, and $R_5$ is a hydrogen atom.

13. A compound represented by formula (V):

Formula (V):

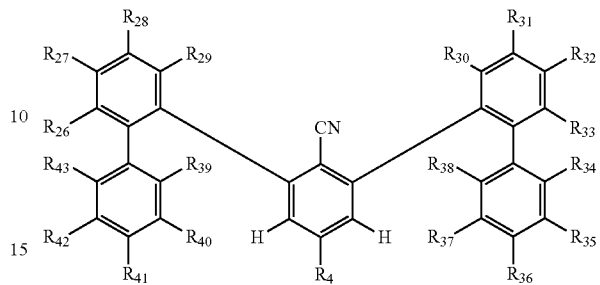

wherein $R_{26}$, $R_{28}$, $R_{29}$, $R_{30}$, $R_{31}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each independently represents a hydrogen atom or a substituent, when $R_{26}$, $R_{28}$, $R_{29}$, $R_{30}$, $R_{31}$, $R_{33}$, $R_{34}$, $R_{35}$, $R_{36}$, $R_{37}$, $R_{38}$, $R_{39}$, $R_{40}$, $R_{41}$, $R_{42}$ and $R_{43}$ each represents a substituent, the substituent may further have a substituent, provided that pairs of $R_{26}$ and $R_{43}$, $R_{26}$ and $R_{39}$, $R_{28}$ and $R_{29}$, $R_{30}$ and $R_{31}$, $R_{33}$ and $R_{34}$, $R_{33}$ and $R_{38}$, $R_{34}$ and $R_{35}$, $R_{35}$ and $R_{36}$, $R_{36}$ and $R_{37}$, $R_{37}$ and $R_{38}$, $R_{39}$ and $R_{40}$, $R_{40}$ and $R_{41}$, $R_{41}$ and $R_{42}$, and $R_{42}$ and $R_{43}$, each does not combine to form a condensed ring; $R_{27}$ and $R_{32}$ each represents a hydrogen atom; and $R_4$ has the same meanings as $R_4$ in formula (III).

14. A compound represented by formula (VI):

Formula (VI):

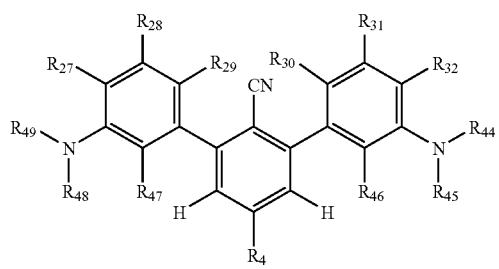

wherein $R_{44}$, $R_{45}$, $R_{48}$ and $R_{49}$ each independently represents a hydrogen atom or a substituent, when $R_{44}$, $R_{45}$, $R_{48}$ and $R_{49}$ each represents a substituent, the substituent may further have a substituent; and pairs of $R_{44}$ and $R_{45}$, and $R_{48}$ and $R_{49}$, each may combine to form a ring;

$R_{46}$ and $R_{47}$ each independently represents a hydrogen atom or a substituent, when $R_{46}$ and $R_{47}$ each represents a substituent, the substituent may further have a substituent, provided that when $R_{28}$, $R_{29}$, $R_{30}$, $R_{31}$, $R_{46}$ and $R_{47}$ each represents a substituent, pairs of $R_{44}$ and $R_{46}$, $R_{45}$ and $R_{46}$, $R_{47}$ and $R_{48}$, and $R_{47}$ and $R_{49}$, each does not combine to form a condensed ring; and $R_4$ represents a hydrogen atom or a substituent; and $R_{28}$, $R_{29}$, $R_{30}$, and $R_{31}$ each independently represents a hydrogen atom or a substituent, when $R_{28}$, $R_{29}$, $R_{30}$, and $R_{31}$ represents a substituent, the substituent may further have a substituent, but pairs of $R_{28}$ and $R_{29}$, $R_{30}$ and $R_{31}$ each does not combine to form a condensed ring; and $R_{27}$ and $R_{32}$ each represents a hydrogen atom.

* * * * *